(12) United States Patent
Lilja

(10) Patent No.: US 11,683,040 B1
(45) Date of Patent: Jun. 20, 2023

(54) CIRCUIT ARCHITECTURE AND LAYOUT FOR A VOTING INTERLOCKED LOGIC CELL

(71) Applicant: Klas Olof Lilja, Pleasanton, CA (US)

(72) Inventor: Klas Olof Lilja, Pleasanton, CA (US)

( * ) Notice: Subject to any disclaimer, the term of this patent is extended or adjusted under 35 U.S.C. 154(b) by 0 days.

(21) Appl. No.: 17/803,280

(22) Filed: Apr. 18, 2022

(51) Int. Cl.
| | |
|---|---|
| H03K 19/1776 | (2020.01) |
| H03K 19/17736 | (2020.01) |
| H03K 19/17784 | (2020.01) |
| H03K 19/23 | (2006.01) |
| G06F 30/392 | (2020.01) |
| G06F 30/398 | (2020.01) |

(52) U.S. Cl.
CPC ....... *H03K 19/1776* (2013.01); *G06F 30/392* (2020.01); *G06F 30/398* (2020.01); *H03K 19/17744* (2013.01); *H03K 19/17784* (2013.01); *H03K 19/23* (2013.01)

(58) Field of Classification Search
None
See application file for complete search history.

(56) References Cited

U.S. PATENT DOCUMENTS

| | | | | |
|---|---|---|---|---|
| 2013/0162293 A1* | 6/2013 | Lilja | ...................... | G06F 30/00 716/121 |
| 2014/0157223 A1* | 6/2014 | Lilja | ..................... | G06F 30/398 716/138 |
| 2019/0081627 A1* | 3/2019 | Lilja | .................. | H03K 19/0013 |

* cited by examiner

*Primary Examiner* — Anh Q Tran

(57) ABSTRACT

This invention comprises an integrated circuit in CMOS technology which can act as a regular sequential logic latch, having one data signal input, or as a voting latch, having three data signal inputs. The circuit schematic of this integrated circuit is such that it allows for a certain placement of the devices in the physical, manufactured integrated circuit that makes it possible to optimize the arrangement of the n-type MOSFET devices and p-type MOSFET devices in the circuit independently, using the Layout Optimization through Error Aware Positioning (LEAP), and thereby to remove, or reduce, the occurrence of radiation generated soft errors.

7 Claims, 37 Drawing Sheets

CIRCUIT ARCHITECTURE AND LAYOUT FOR A VOTING INTERLOCKED LOGIC CELL

CROSS REFERENCE TO RELATED APPLICATIONS

This application is a non-provisional utility application claiming priority to U.S. provisional application No. 63/259,272 filed Jun. 28, 2021.

BACKGROUND OF THE INVENTION

This invention consists of a sequential logic cell. It comprises both a new circuit (including different variants), and a particular layout, i.e., spatial arrangement of the different devices in the circuit in a physical implementation of the cell. Sequential logic cells are used in logic integrated circuits to temporarily store a data value. A sequential logic cell consists of the circuit that keeps a certain data signal, at least one output connection which provides the stored value to other parts of the IC circuits, one data input connection (D), which provides a new data value to be stored by the sequential element, one control input connection (CK) which determines if and when the new data on the data input (D) should be written into the sequential cell (and stored). In addition, a sequential logic cell may contain additional input connections to change the data stored by the cell. Such additional signals include clear (CLR) and preset (PRESET) which sets the value stored by the cell regardless of the value on the data (D) input. The basic sequential logic cells are the latch and the static random access memory cells. Another common sequential logic cell is the flip-flop.

This invention is concerned with sequential logic cells used in complementary metal oxide semiconductor (CMOS) technology. This technology is the most common technology used in integrated circuits (ICs) today. It uses two types of metal oxide semiconductor field effect transistors (MOSFET), the n-type MOSFET and the p-type MOSFET, to form the logic circuitry of the IC. CMOS technology and MOSFET devices are well known to anyone familiar with integrated circuits, and these terms are used to describe a specific type of logic circuits and semiconductor devices, regardless of specific materials used to manufacture the devices and circuits.

Sequential logic cells are used very frequently in a logic IC and their electrical performance (speed, power), size, and reliability are very important factors for the overall performance and quality of an IC. This invention comprises a certain way to connect n-type MOSFETs and p-type MOSFETs to form the circuit for the sequential elements which improves properties of the sequential cell vs. prior art, and which improves certain reliability aspects of the sequential cell vs. prior art.

PRIOR ART

A common, prior art, basic latch or SRAM sequential cell consists of two cross-coupled inverter cells (INVs). In this circuit the ability to store a data value is accomplished by connecting the output of a first inverter circuit cell (INV) to the input of a second INV, and connecting the output of the second INV to the input of the first INV. In CMOS technology this circuit is realized by two INVs consisting of a p-type MOSFET and an n-type MOSFET connected in series between a high data signal, being the high electric potential, VDD, of the logic circuit, and a low data signal, being the low electric potential of the logic circuit. This basic circuit is shown in FIG. 1. This circuit can be in one of two states. In one state the output of the first INV is LOW (VSS) and the output of the second INV is HIGH, VDD. In the other state the output of the first INV is HIGH, VDD, and the output of the second INV is LOW, VSS.

In order to switch this circuit between the two states, additional MOSFETs, and input connections, are added to the circuit. Typically one of three main different ways (clocked-inverter (clocked-INV), transmission-gate (TG) circuit, and SRAM-style clocking) to accomplish is applied. FIG. 2 shows clocked-INV, also referred to as tri-state inverter, clocking. In this circuit a first input connection (D) is provided, which provides the value of the new data to be stored, and a second input connection, CK, is provided, which controls whether the circuit should write in the new data, or keep the prior data. The circuit operates as follows: when the control signal, CK, has a first value (HIGH in the circuit in FIG. 2), the basic cross-coupled INV is connected as in the original circuit, and the circuit keeps its' current value. However, when the control signal, CK, has a second value, complementary (opposite) to the first value (LOW in the circuit in FIG. 2), the connection between the two INVs in the basic cross-coupled INV is broken, and, at the same time, the new data input connection, D, is connected into the circuit. Hence, the new data value, D, will be written into the circuit.

Two different versions of the TG clocking circuit are shown in FIGS. 3 and 4. As with the clocked-INV circuit, the control signal, CK, is used to write in a new data value, D, by both disconnecting the original cross-coupled NV circuit and connecting the new data value, D, into the circuit.

An SRAM-style cocking circuit is shown in FIG. 5. In this circuit the control signal, CK, does not disconnect the basic cross-coupled NV circuit. Instead, when a new value should be written in, the input data signal D, is connected to the output of one of the INVs in the original circuit, and the complementary of D (opposite value) is connected to the output of the other INV. Hence the switching to the new data value is accomplished by overwriting both values (output of both INVs) of the basic cross-coupled INV circuit.

A fourth clocking style, from U.S. patent Utility application Ser. No. 15/430,484, is shown in FIG. 6. Like the SRAM-style clocking this clocking circuitry is only using one phase of the clock signal, and does not require that the complement of the clock-signal is generated by the sequential element. In the following this clocking scheme is referred to as single-phase clocking.

An error occurs in a logic circuit if the stored data value in a sequential logic cell changes unintentionally. Such an error is called a soft error. In modern integrated electronic circuits, the most common cause of soft errors is radiation from the environment. A soft error caused by radiation is also referred to as a single event. It is therefore desirable to have access to sequential logic cells that are less sensitive to radiation. A common, prior art, sequential logic cell which reduces the sensitivity to soft errors caused by radiation is the Dual Interlocked Cell (DICE). The basic circuit of the DICE cell consists of 4 basic INVs instead of two. These 4 INVs are interconnected in such a manner that if one of the outputs of the INVs switches value, the total circuit will still not change its stored value, but, rather, the circuit will restore the correct value to the one INV output that changed, and the output of the circuit will still be the same, correct, value. The basic, prior art, DICE circuit cell is shown in FIG. 7. As with the basic cross-coupled INV circuit above, this DICE circuit can be, and is, extended with additional MOSFET devices to enable a controlled writing in of a new data value to store by the sequential cell.

Another, prior art, way to achieve a reduced sensitivity to soft errors is to use so called triple mode redundancy (TMR). In TMR a single sequential element is replaced by 3 sequential elements, each storing the same data, and, in the basic TMR implementation, the output of each of these 3 sequential elements is connected to a circuit, the output of which is a majority vote between its 3 inputs. Hence, if a soft error occurs in one of the 3 sequential elements, the output of the voter will still be correct, and this voter output signal is what is transferred to the subsequent circuitry.

Both the DICE sequential cell, and the TMR circuits, contain extra (redundant) nodes storing the correct data value, and both these circuits are vulnerable to soft errors if more than one of the nodes in the circuit changes its value. A special, prior art, technique, layout design through error aware positioning (LEAP) has been invented (U.S. Pat. No. 8,468,484 and follow-on U.S. patents by the same inventor) which makes it possible to create spatial arrangement of the devices in the physical implementation of the DICE circuit that minimizes, or removes, the possibility to create a soft error in this circuit by effects caused by radiation from the environment. The LEAP technique has proven tremendously effective and DICE-type sequential logic cell implemented using the LEAP technique (LEAPDICE cells) are being used today in many integrated circuit products in advanced semiconductor technologies. However, in certain semiconductor technologies, the design rules (i.e., the constraints imposed by the technology itself) may be such that it becomes exceedingly difficult to implement the LEAP technique for the DICE circuit. This invention devices a sequential logic cell that is such that it can be implemented using the LEAP technique, even for semiconductor technologies where the DICE circuit cannot be implemented using LEAP.

BRIEF DESCRIPTION OF THE INVENTION

This invention comprises a new way to connect n-type and p-type MOSFET devices to form a sequential logic element that can perform the same function as the prior art sequential logic elements. The new sequential logic thus created contains additional p-type and n-type MOSFET devices and, internally, operates in a different way, w.r.t. how it stores data, and how new data is written in to the cell. This gives this new cell certain new and different properties. One such new property is possible to arrange the different p-type and n-type MOSFET devices, spatially, in a physical implementation of the cell, in a certain way that is very advantageous for the reduction, or removal, of soft errors, and which is not possible to do using (the circuits of) prior art sequential logic cells. Specifically, it is possible to create a physical implementation of this cell using the LEAP technique, in certain cases where such a layout cannot be implemented for the prior art DICE circuit because of special constraint from the semiconductor technology (the design rules of the technology). Another unique property of the new sequential logic cell, is that it can be configured such that it has one single input D and functions precisely as prior art sequential logic cells, or be configured such that it has 3 separate inputs, e.g., D0, D1, D2, and that, in this configuration, the output Q always is the result of a vote between the values of the 3 input data signals. In fact, the basic circuit of this new sequential logic cell is such that the output always is a majority vote of three internally stored data values, and this voting mechanism is accomplished, automatically, through the inter-locked connections of the outputs of internal INV cells, to the input of other internal INV cells. Hence, the new cell can be considered a Voting Interlocked Cell (VICE).

BRIEF DESCRIPTION OF THE DRAWINGS AND FIGURES

Figure 8:
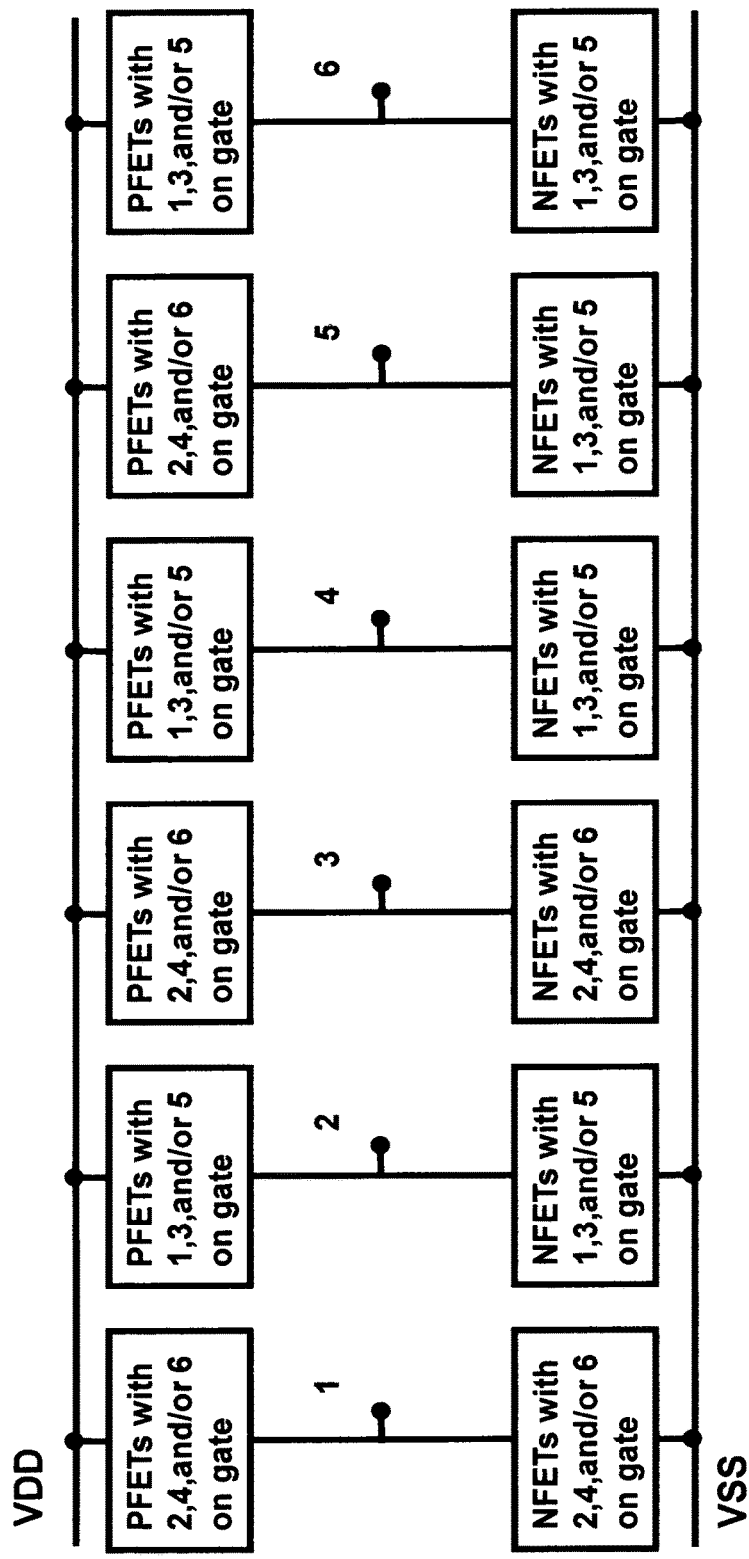

FIG. 8 shows the principle arrangement of the circuit in the invention. Six circuit legs controlling six storage nodes. The six storage nodes are divided into two groups (1, 3, 5) and (2, 4, 6). For each storage node there is a set of p-type MOSFETs that connect the storage nodes to HIGH (VDD) and a set of n-type MOSFETs that connect the storage node to LOW (VSS). Six of these sets consists of two MOSFETs in series, and the other six of 3 MOSFETs with 2 of them in parallel an the third MOSFET in series with the two parallel MOSFETs. The gates of a set of MOSFETs connecting a storage node from one group, are connected to different storage nodes from the other group. Each storage node is connected to at least 2 gates of p-type MOSFETs and 2 gates of n-type MOSFETs.

Figure 9:
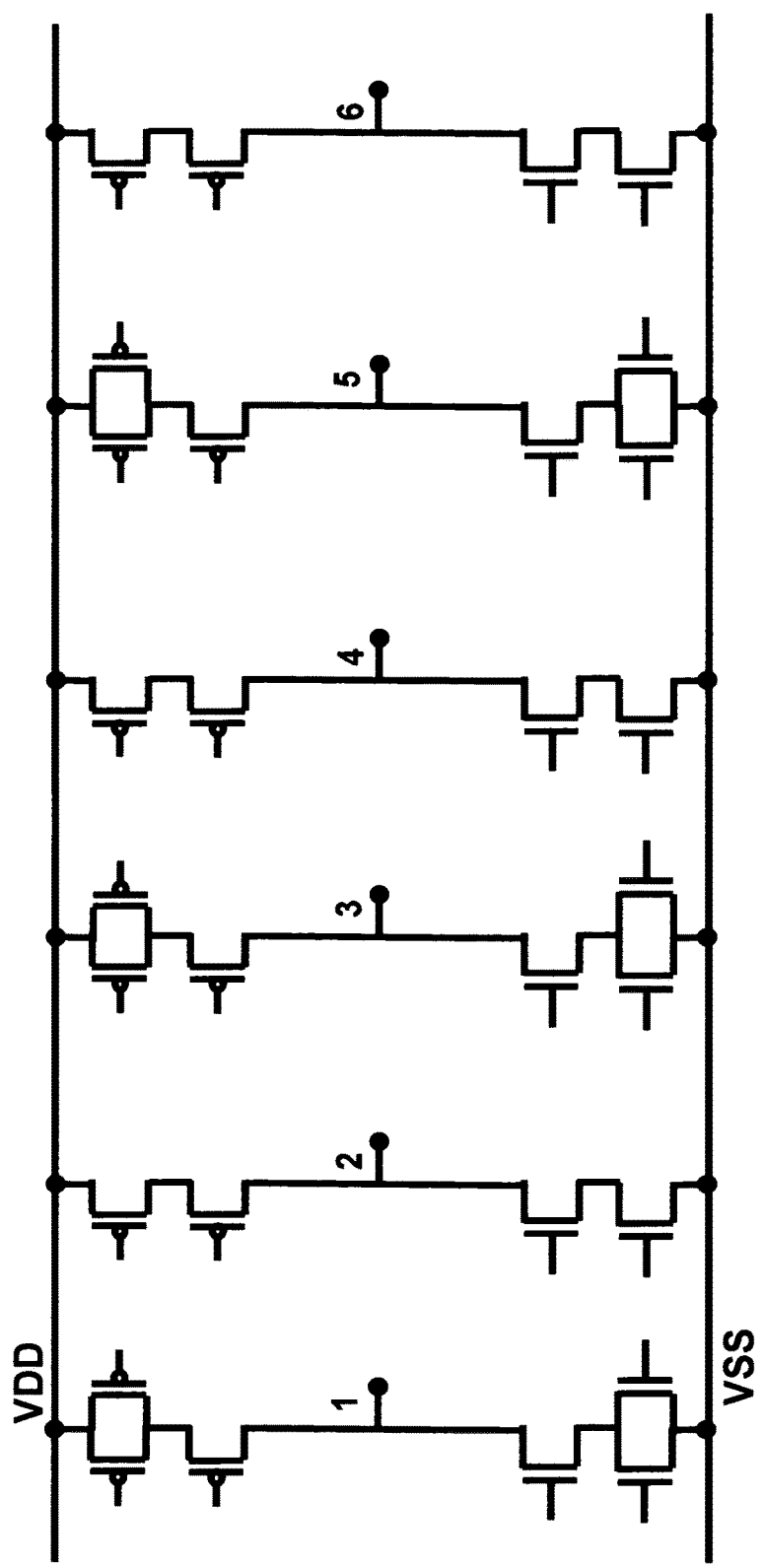

FIG. 9 shows one example of a circuit topology (topology A) that can be used to realize the invention (there are also additional topologies that can realize the invention).

Figure 10:
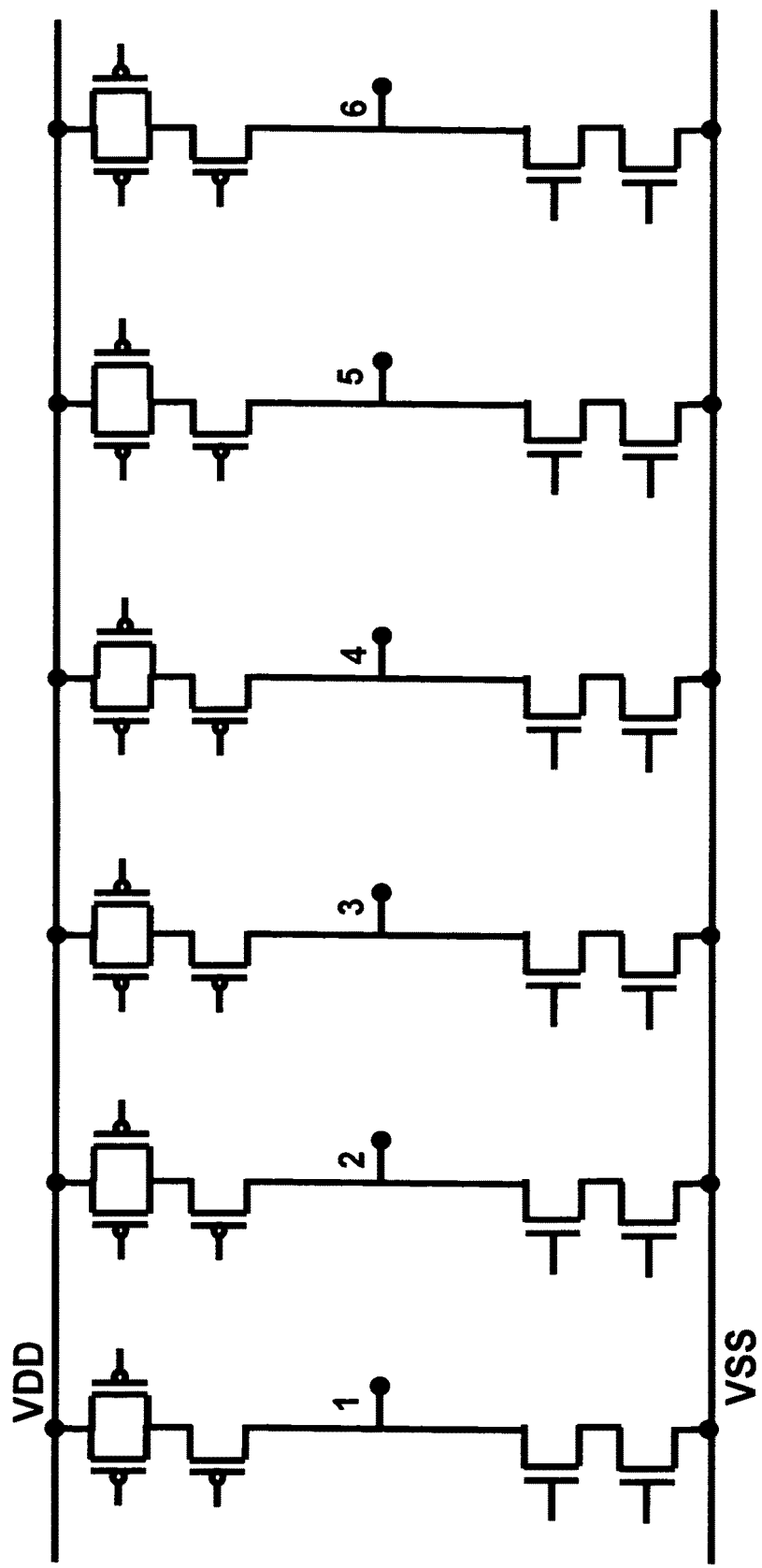

FIG. 10 shows one example of a circuit topology (topology B) that can be used to realize the invention (there are also additional topologies that can realize the invention).

Figure 11:
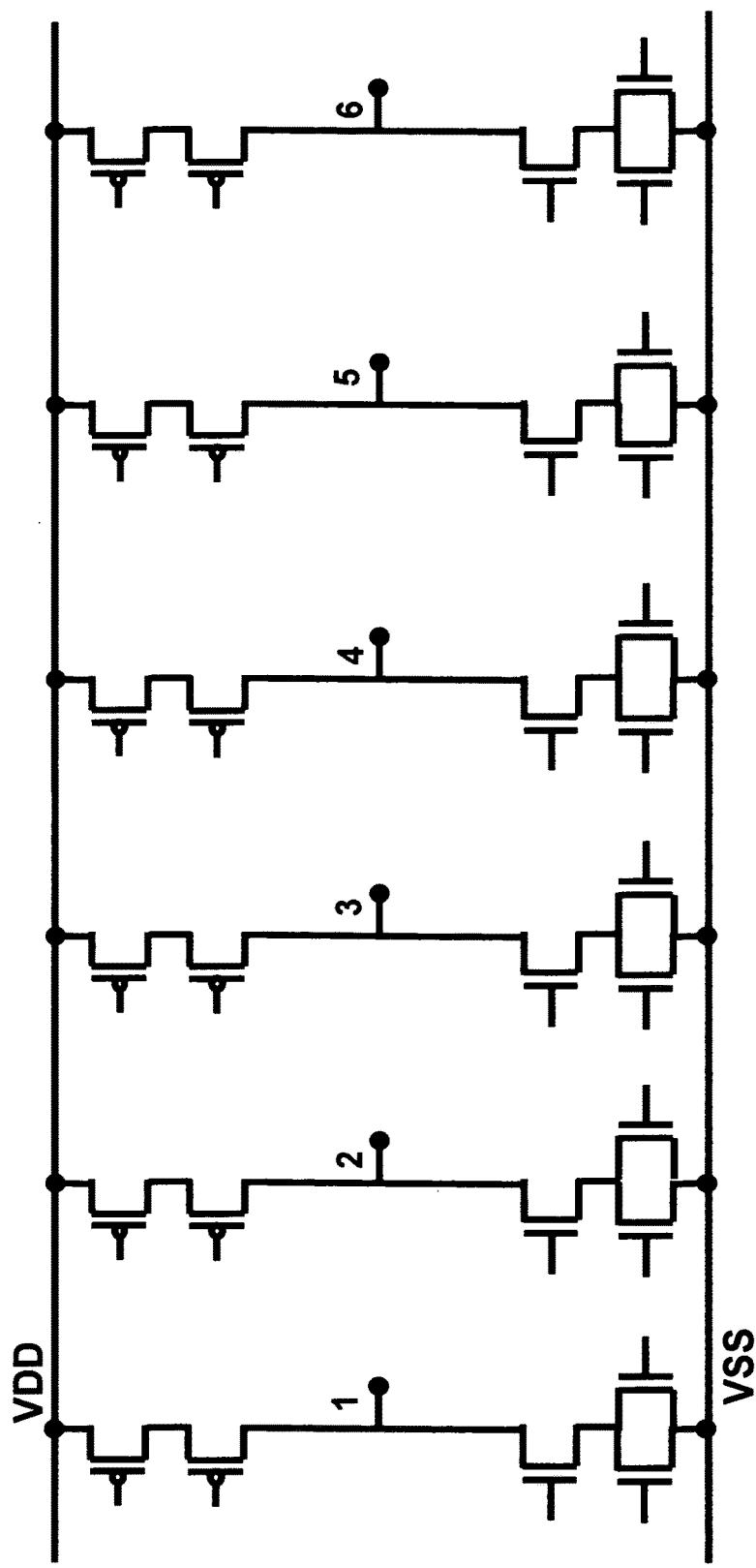

FIG. 11 shows one example of a circuit topology (topology C) that can be used to realize the invention (there are also additional topologies that can realize the invention).

Figure 12:
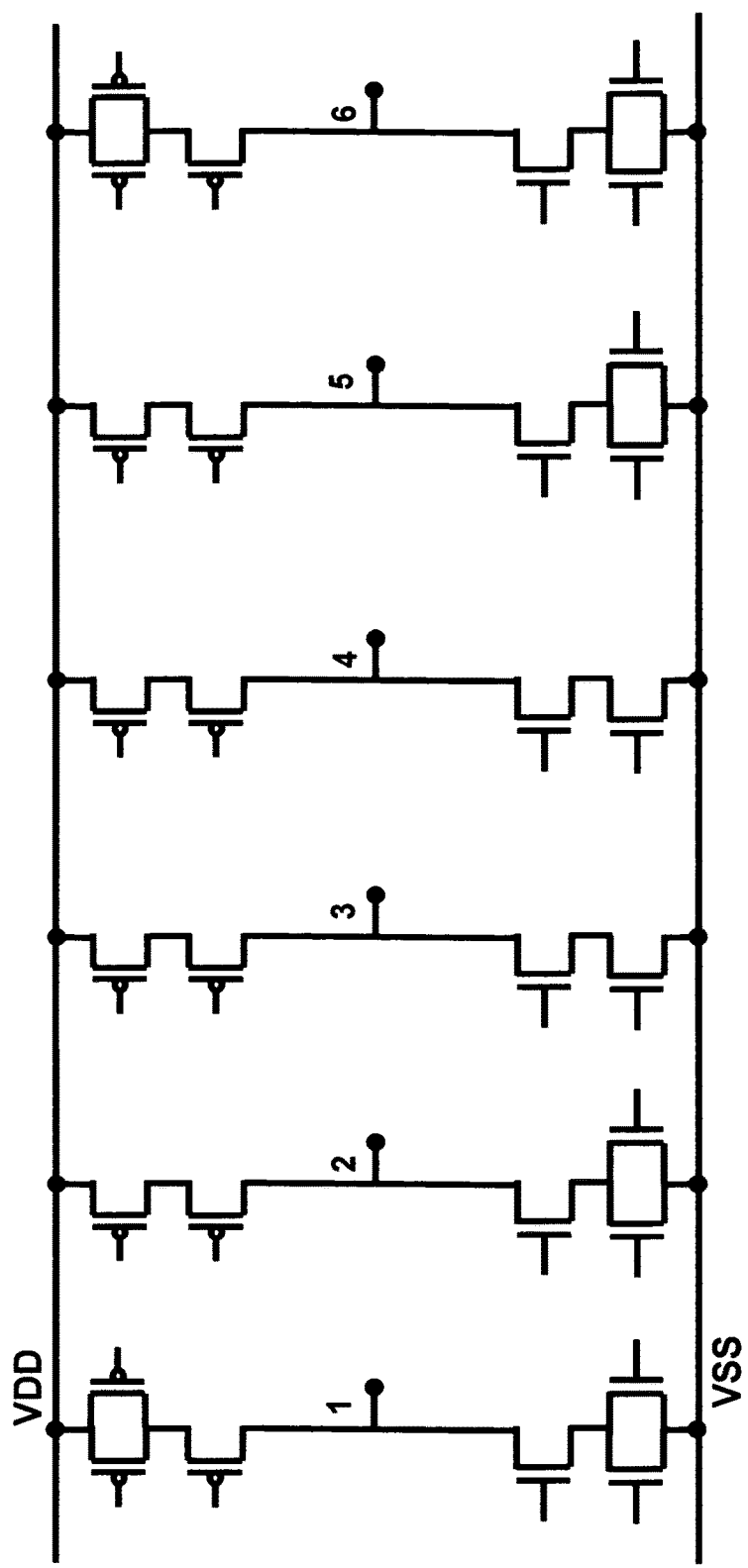

FIG. 12 shows one example of a circuit topology (topology D) that can be used to realize the invention (there are also additional topologies that can realize the invention).

Figure 13:
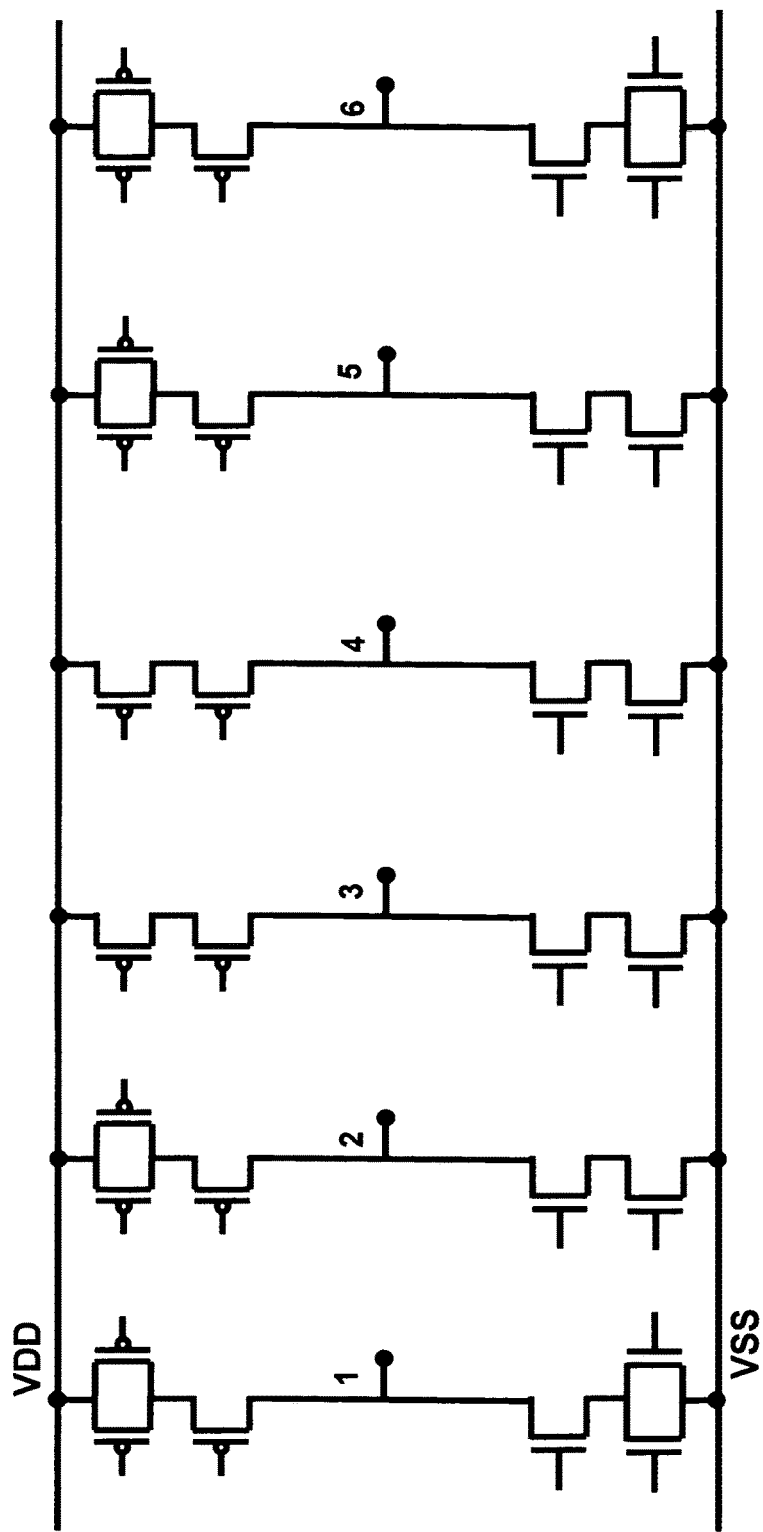

FIG. 13 shows one example of a circuit topology (topology E) that can be used to realize the invention (there are also additional topologies that can realize the invention).

Figure 14:
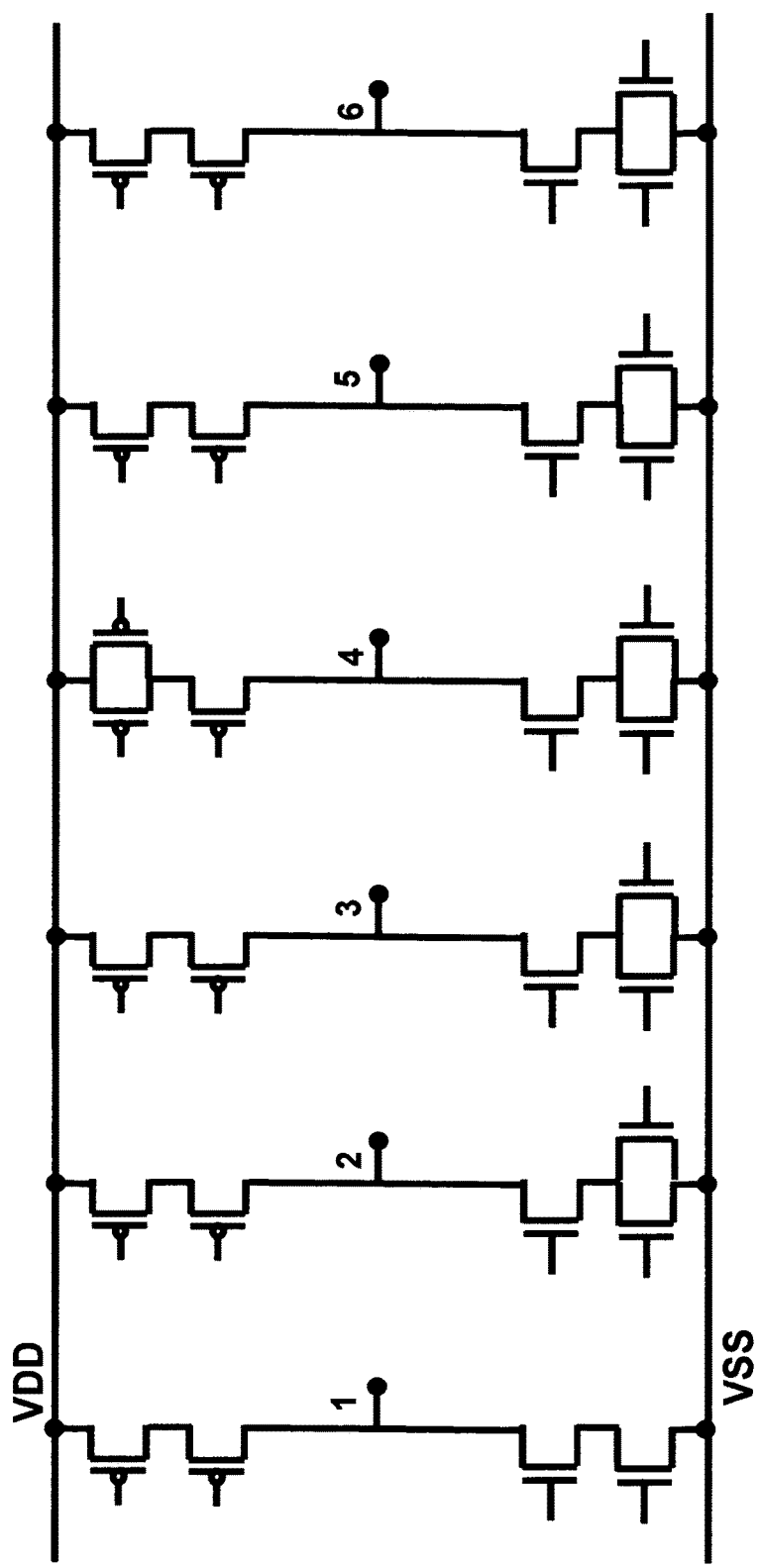

FIG. 14 shows one example of a circuit topology (topology F) that can be used to realize the invention (there are also additional topologies that can realize the invention).

Figure 15:
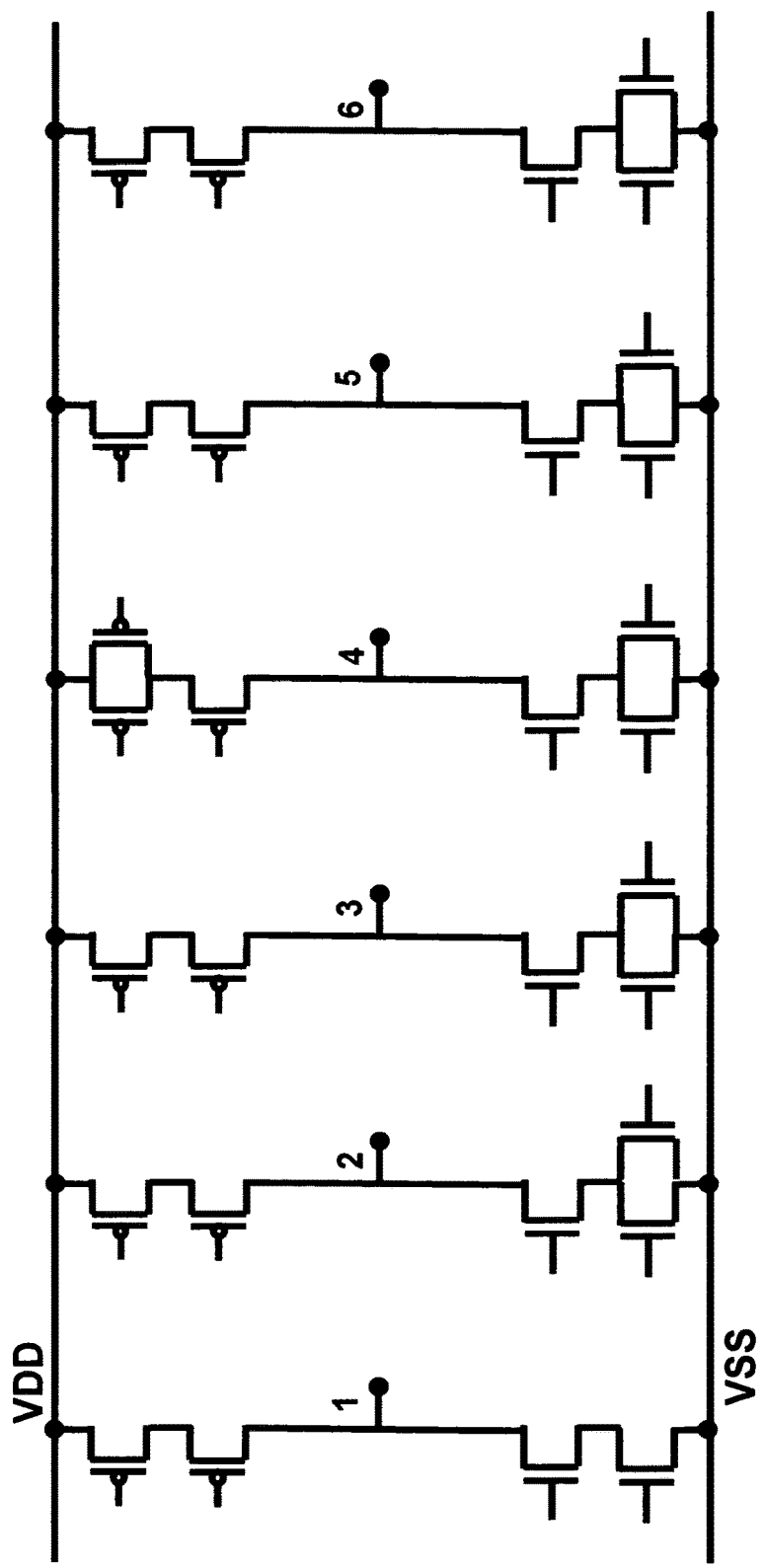

FIG. 15 shows one example of a circuit topology (topology G) that can be used to realize the invention (there are also additional topologies that can realize the invention).

Figure 16:
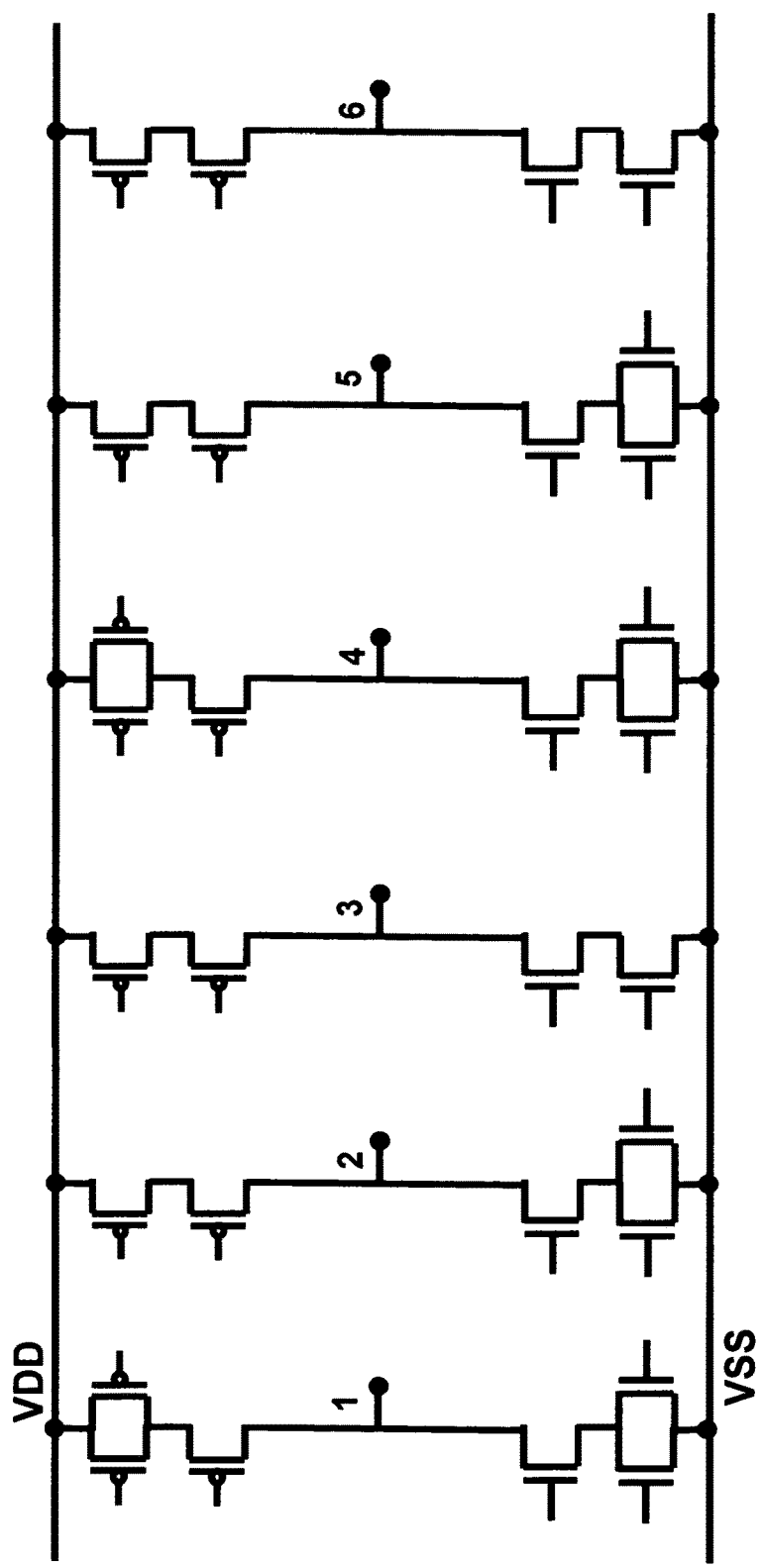

FIG. 16 shows one example of a circuit topology (topology H) that can be used to realize the invention (there are also additional topologies that can realize the invention).

Figure 7:
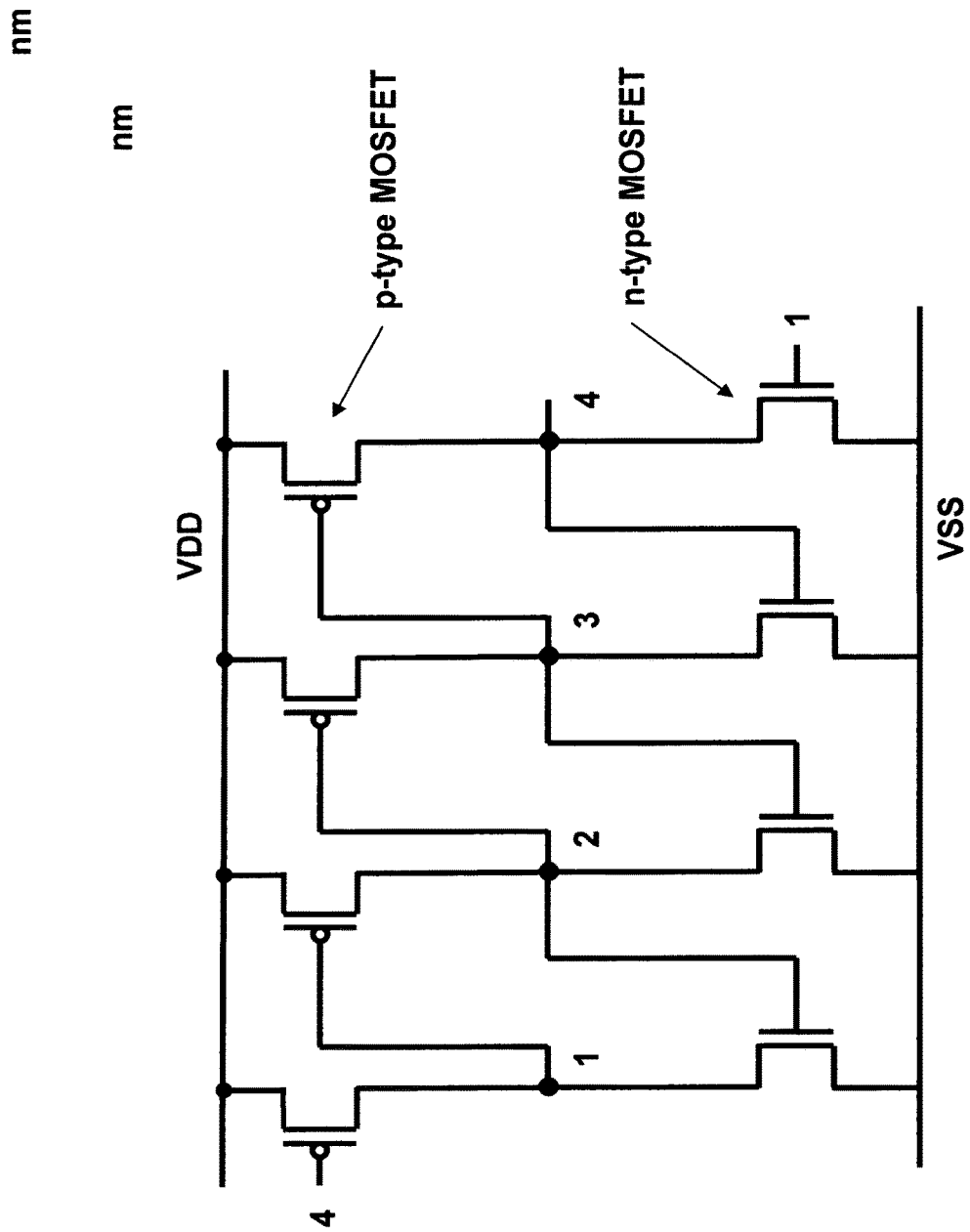
FIG. 7 shows the basic schematic of a Dual Interlocked Cell (DICE) (PRIOR ART).
Figure 17:
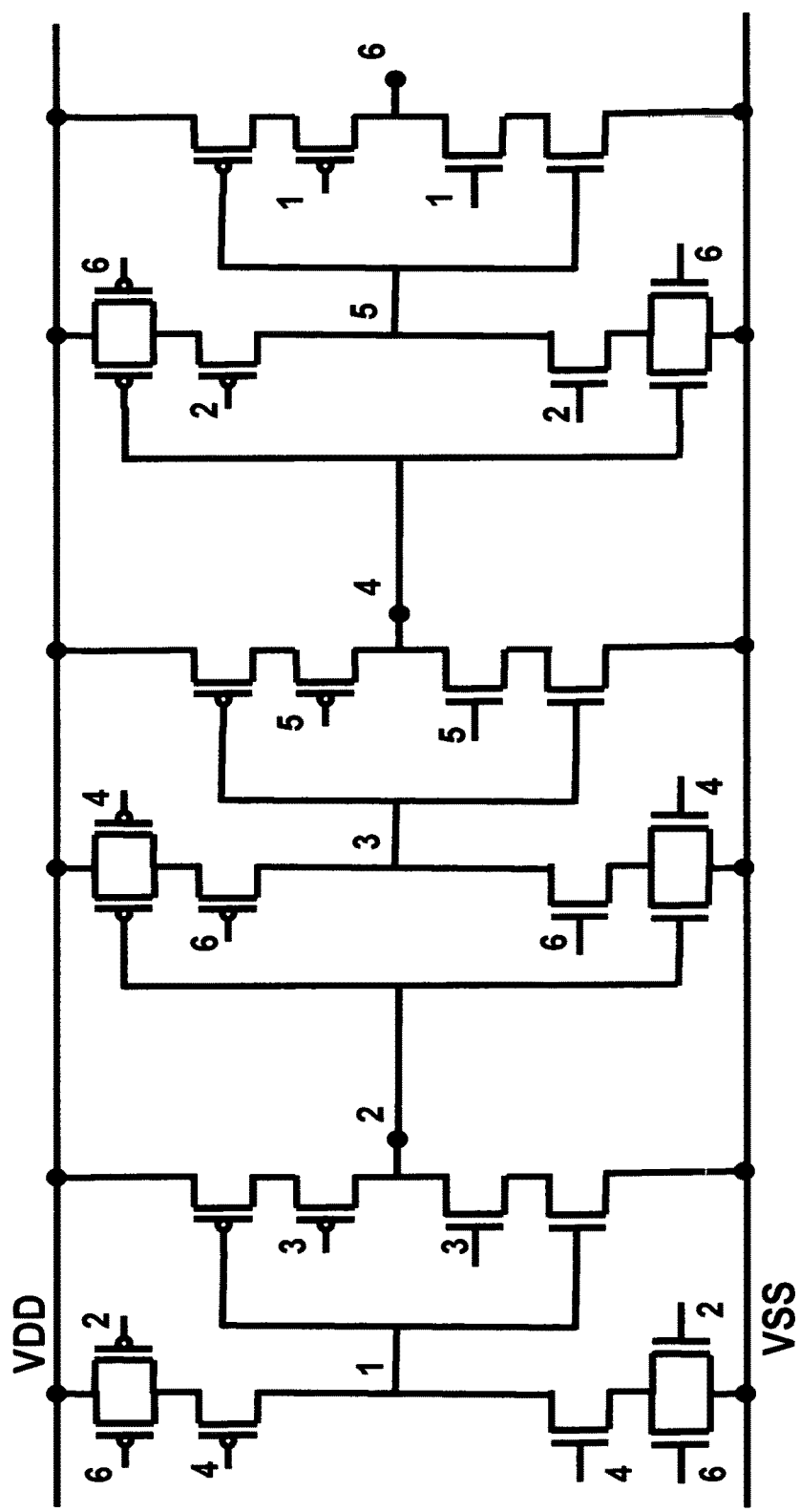

FIG. 17 shows which storage node that is connected to which MOSFET gate for one realization of the invention using topology A from FIG. 7.

Figure 18:
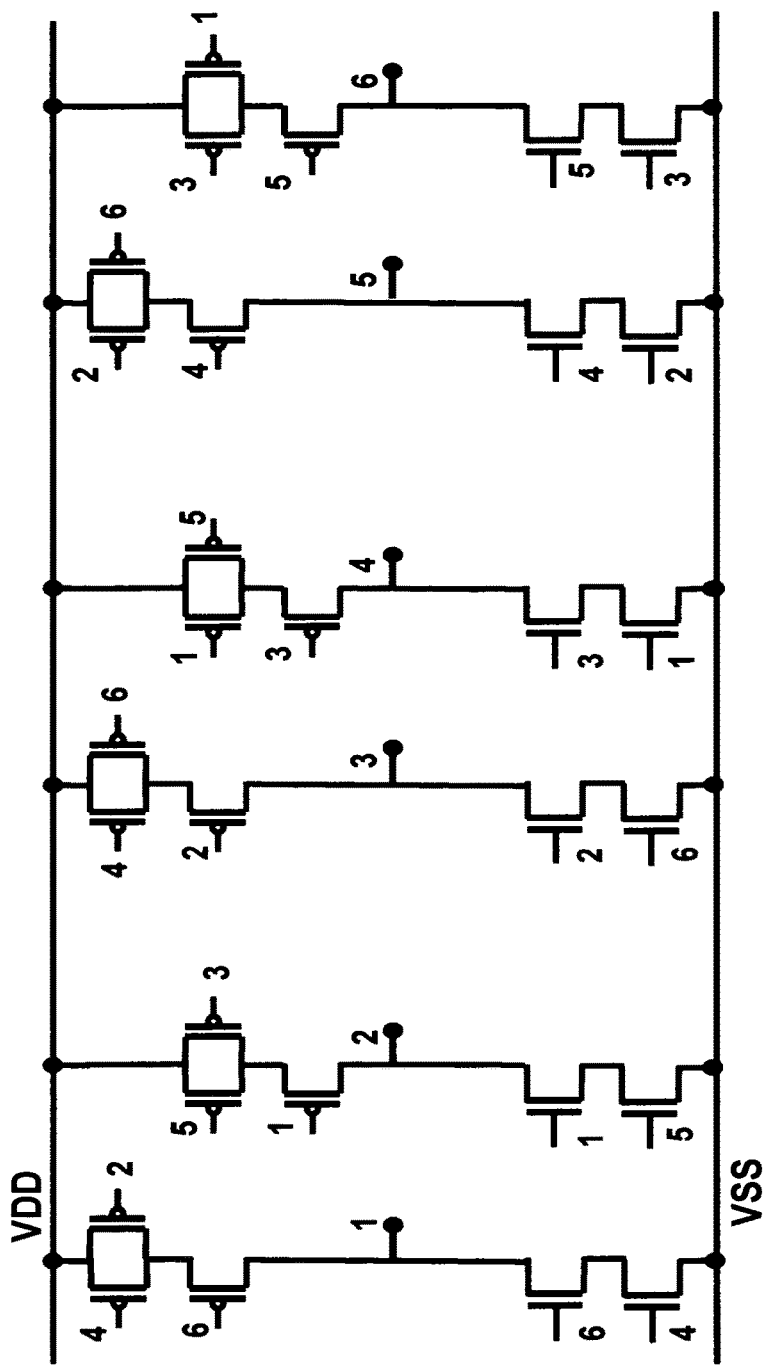

FIG. 18 shows an arrangement for the gate connections for topology B from FIG. 8, which fulfills the desired circuit function.

Figure 19:
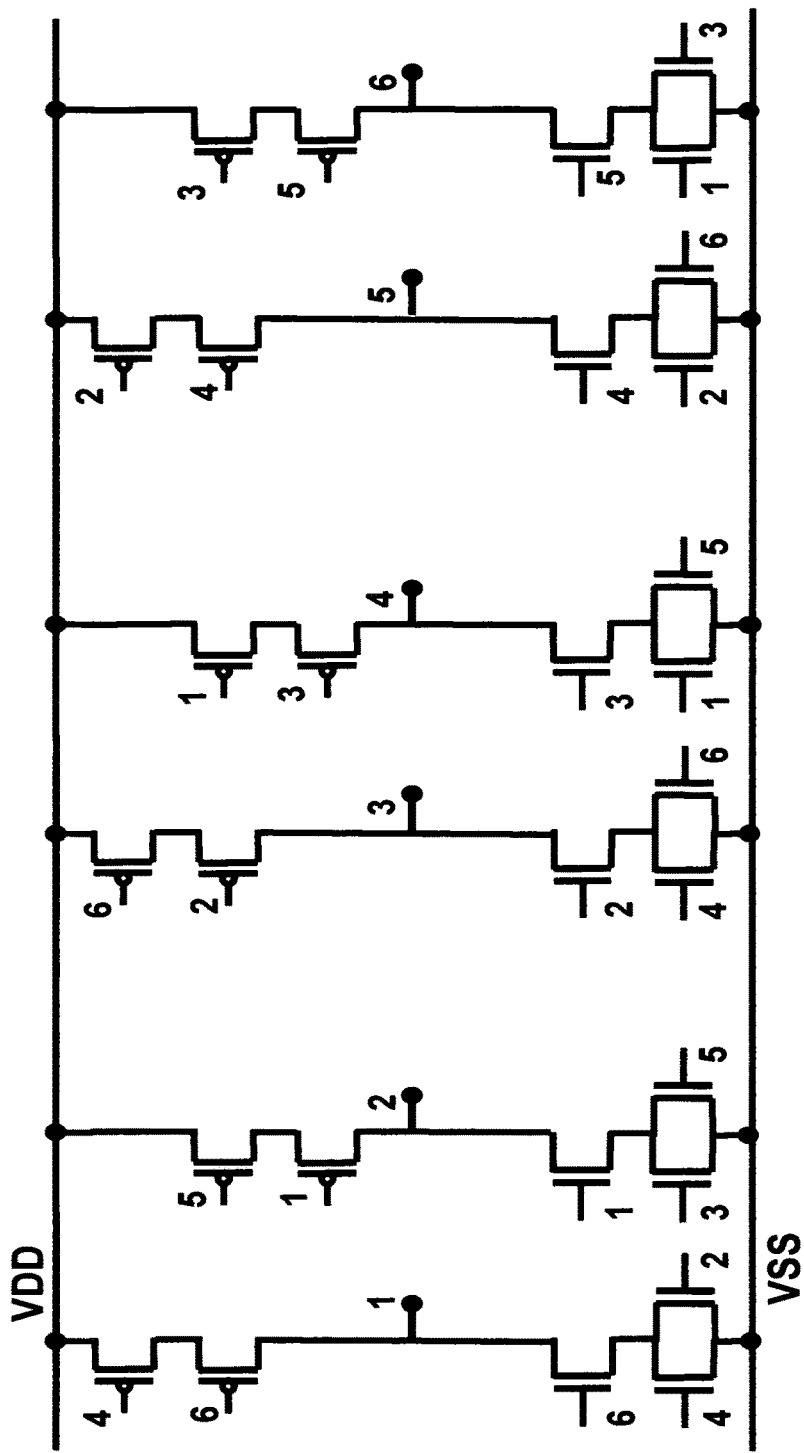

FIG. 19 shows an arrangement for the gate connections for topology C from FIG. 8, which fulfills the desired circuit function.

Figure 20:
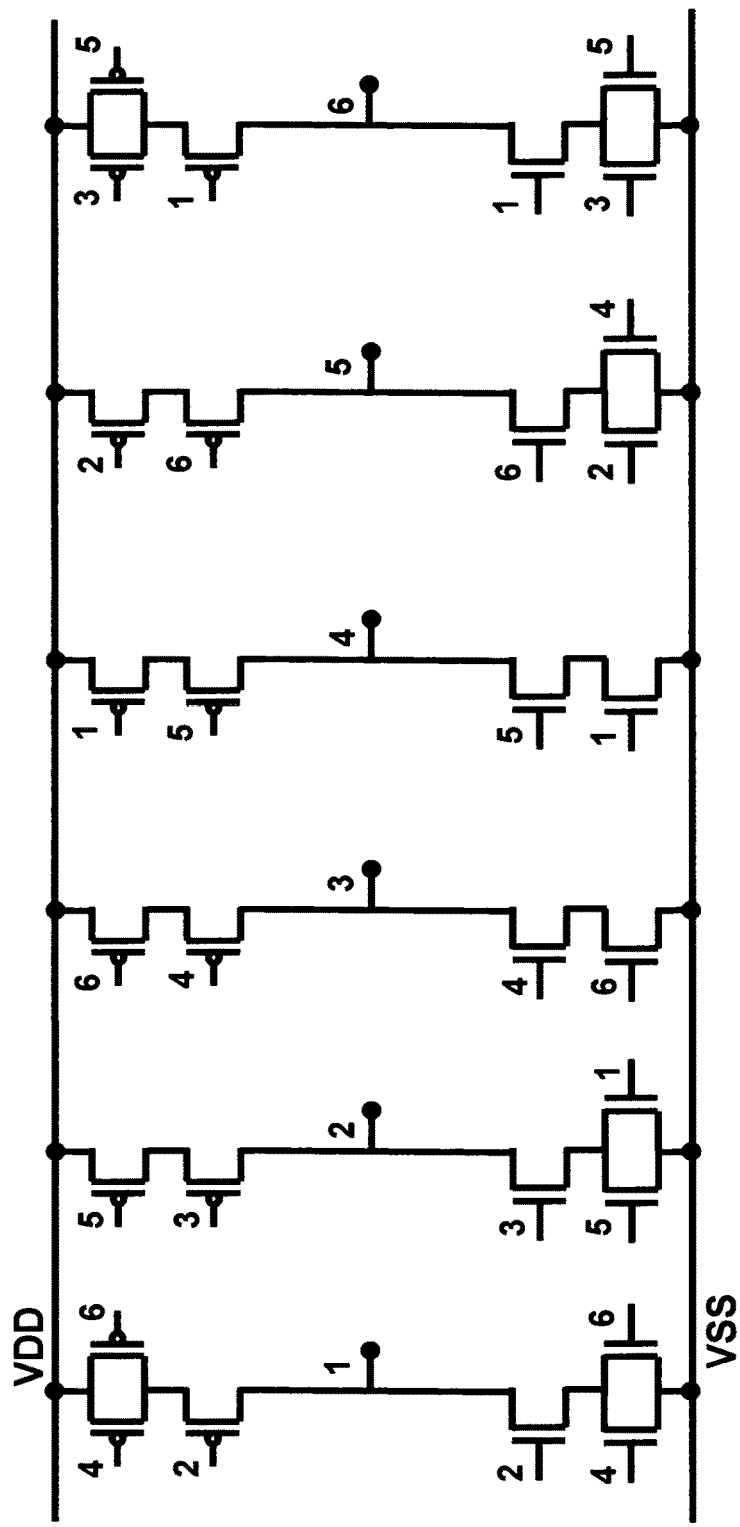

FIG. 20 shows an arrangement for the gate connections for topology D from FIG. 8, which fulfills the desired circuit function.

Figure 21:
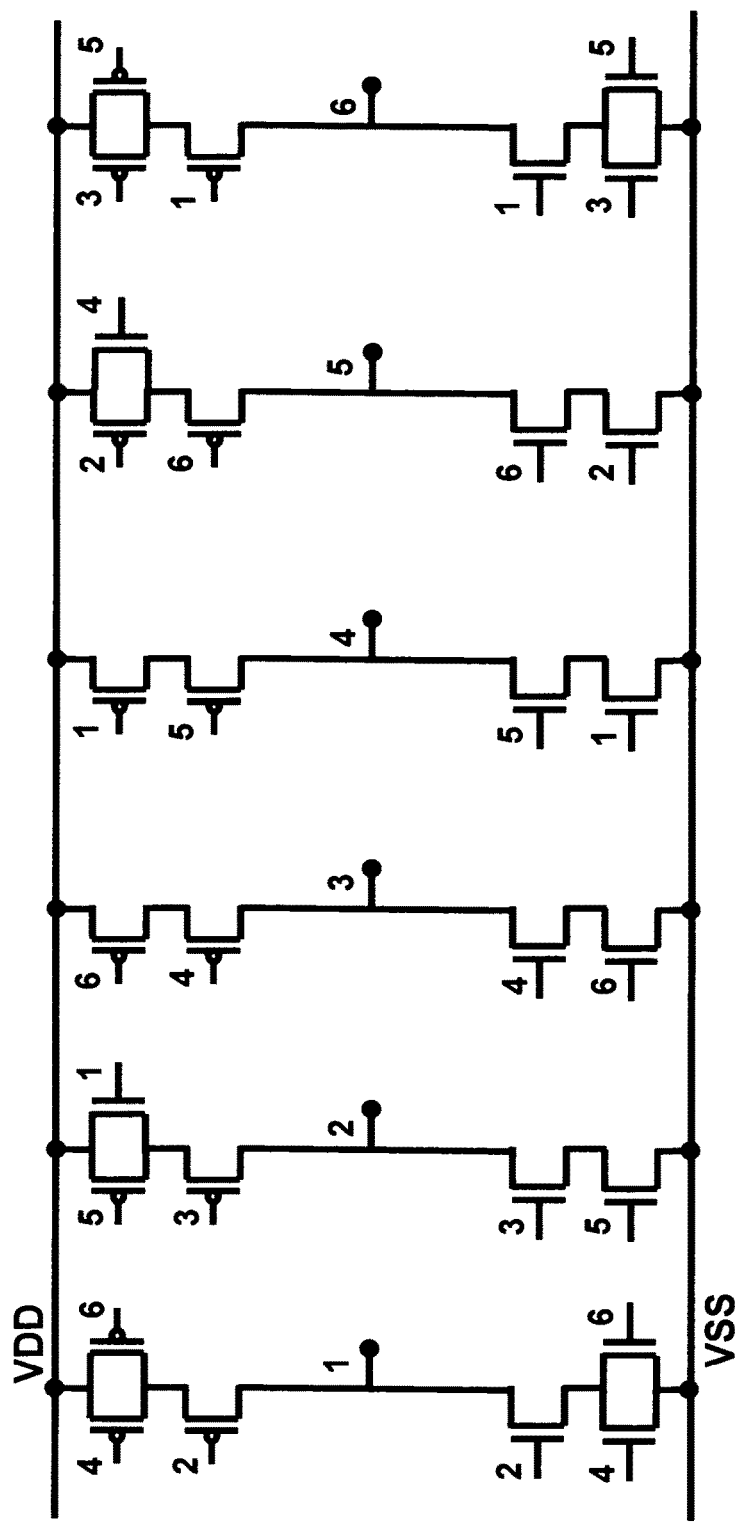

FIG. 21 shows an arrangement for the gate connections for topology E from FIG. 8, which fulfills the desired circuit function.

Figure 22:
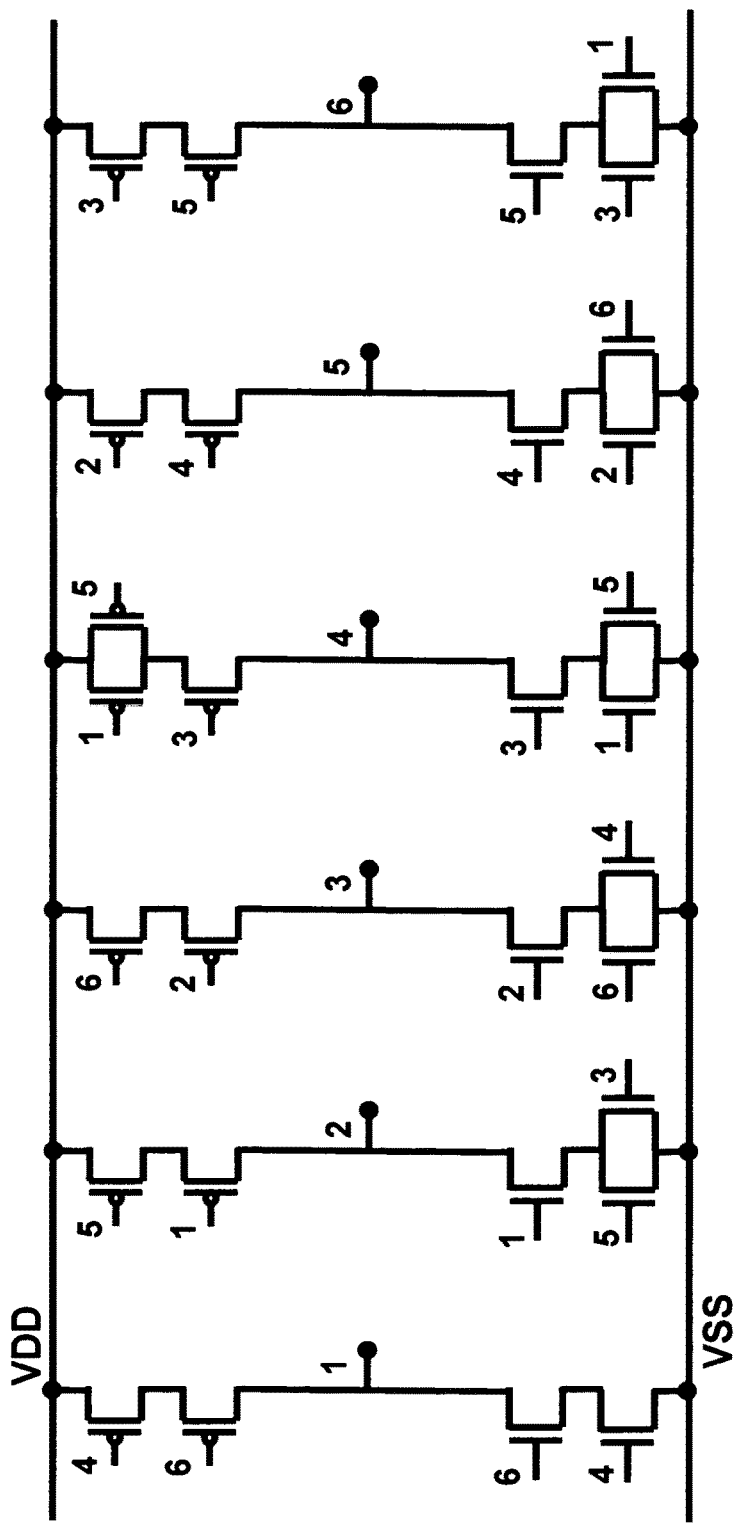

FIG. 22 shows an arrangement for the gate connections for topology F from FIG. 8, which fulfills the desired circuit function.

Figure 23:
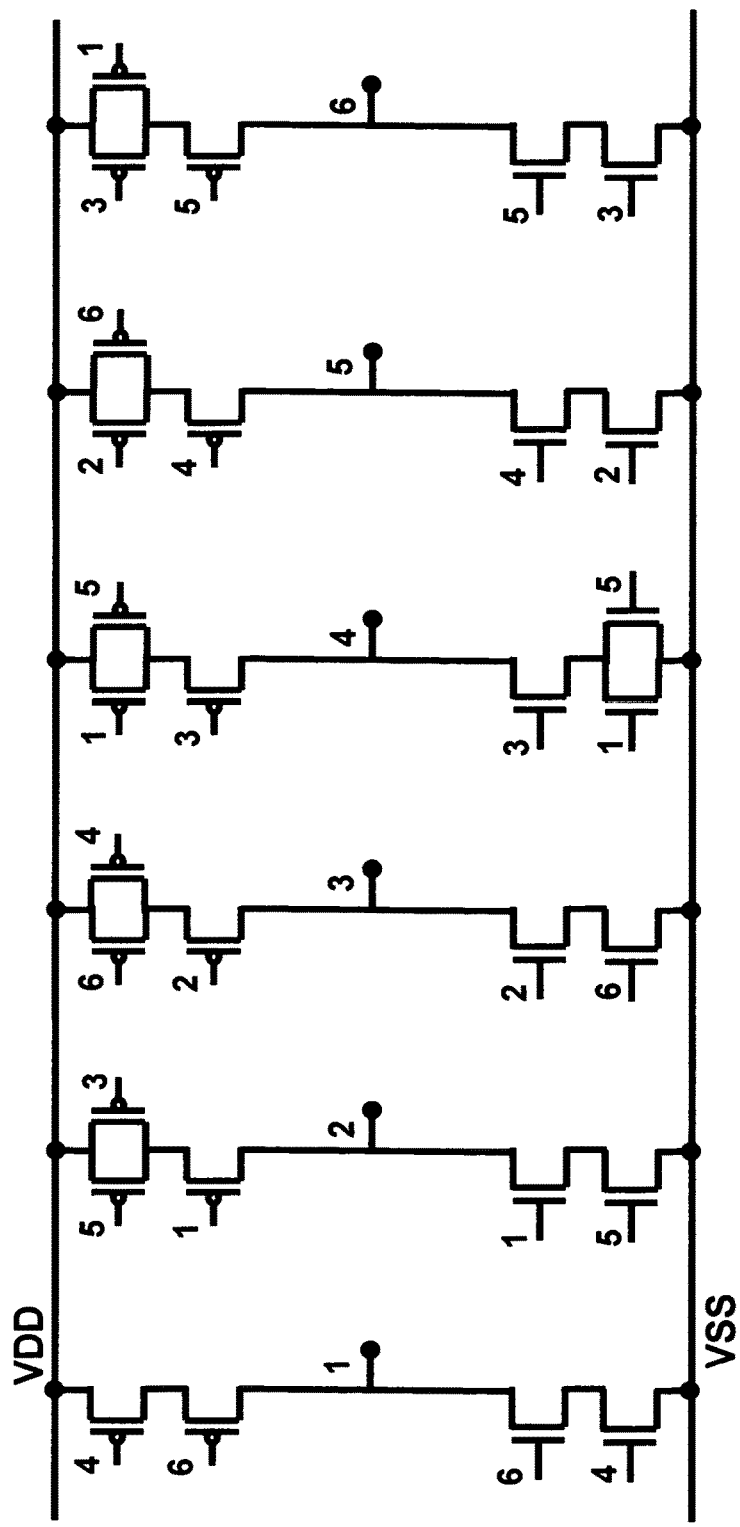

FIG. 23 shows an arrangement for the gate connections for topology G from FIG. 8, which fulfills the desired circuit function.

Figure 24:
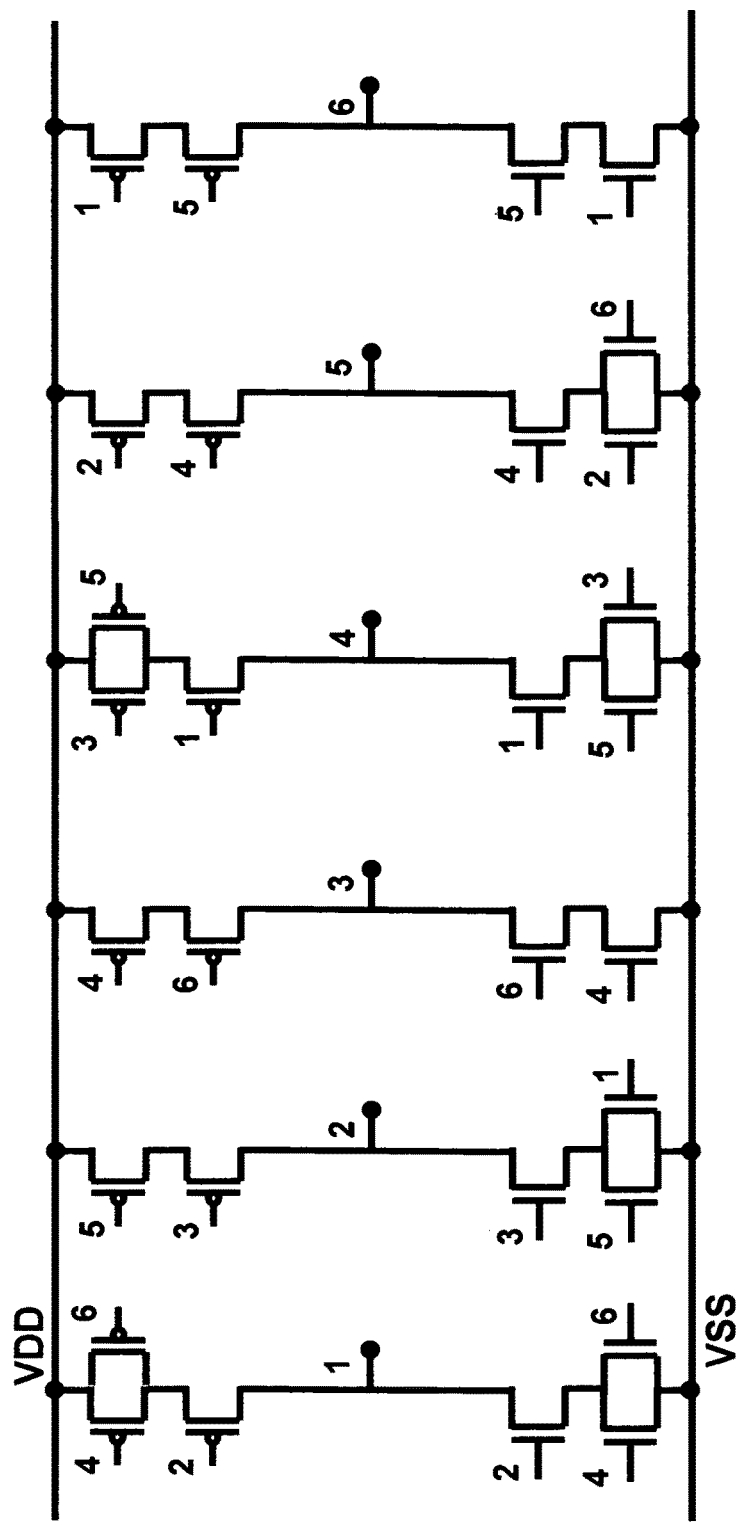

FIG. 24 shows an arrangement for the gate connections for topology H from FIG. 8, which fulfills the desired circuit function.

Figure 25:
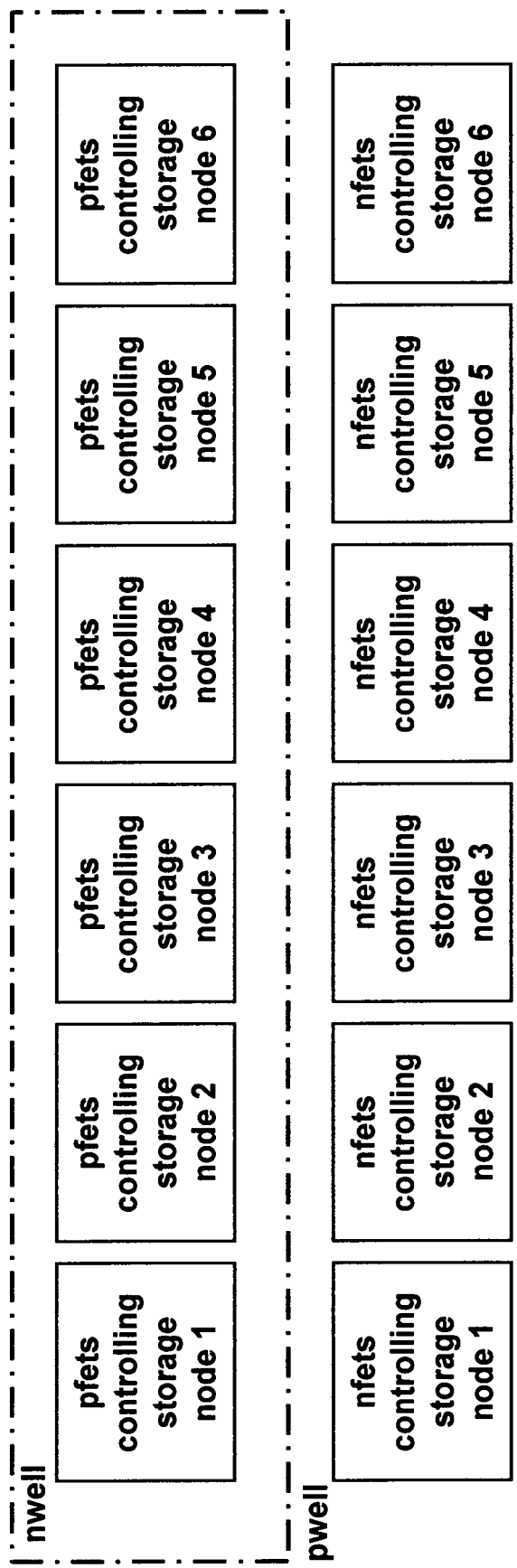

FIG. 25 shows a principle arrangement of the layout using the Layout optimization through Layout Aware Position (LEAP) method for the circuit in this invention. A single event generated error on one of the p-type MOSFETs (pfets) or n-type MOSFETs (nfets) in one group acts in the opposite way to the nfets and pfet from the other group w.r.t. the overall state of the circuit. Therefore pfets or nfets controlling storage nodes from the same group should not be adjacent. Instead pfets and nfets from different groups, for which a single event acts in opposite ways on the overall circuit, should be adjacent.

Figure 26:
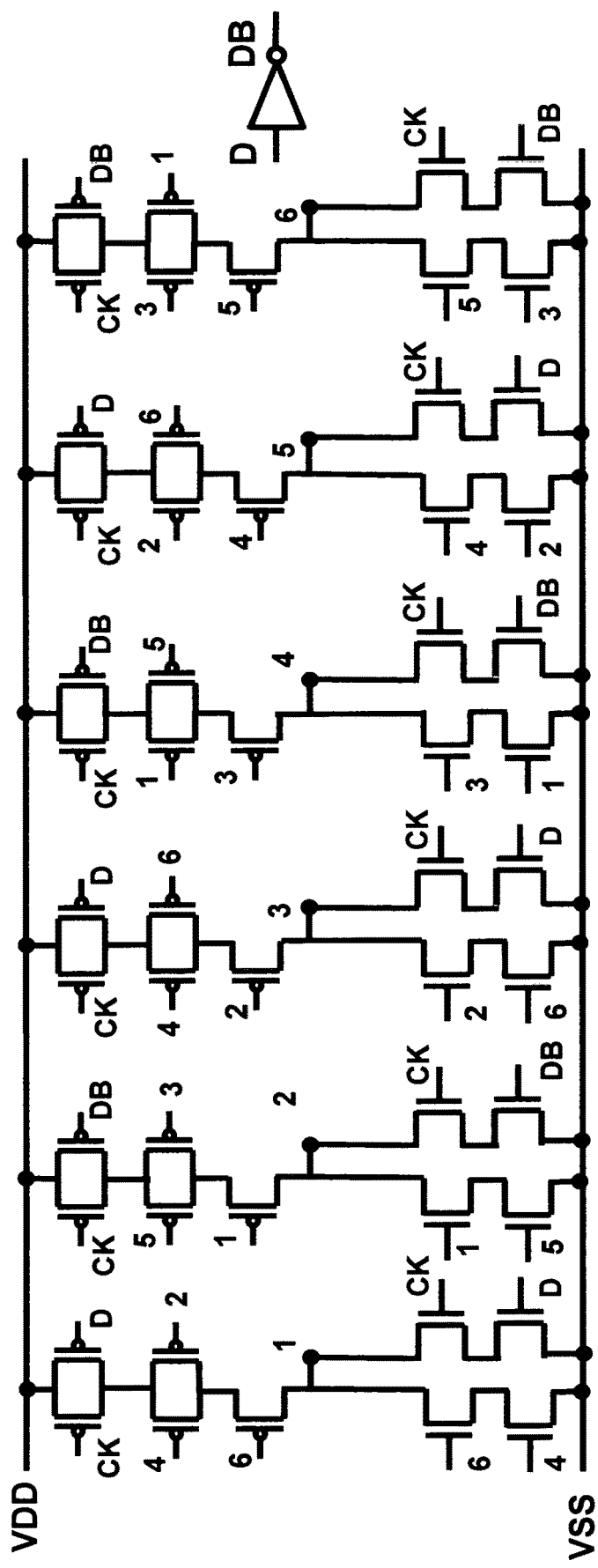

FIG. 26 shows the schematic of a realization of the sequential cell in this invention using the basic circuit from FIG. 11 and using the single-phase clocking circuitry to clock in a data signal.

Figure 27:
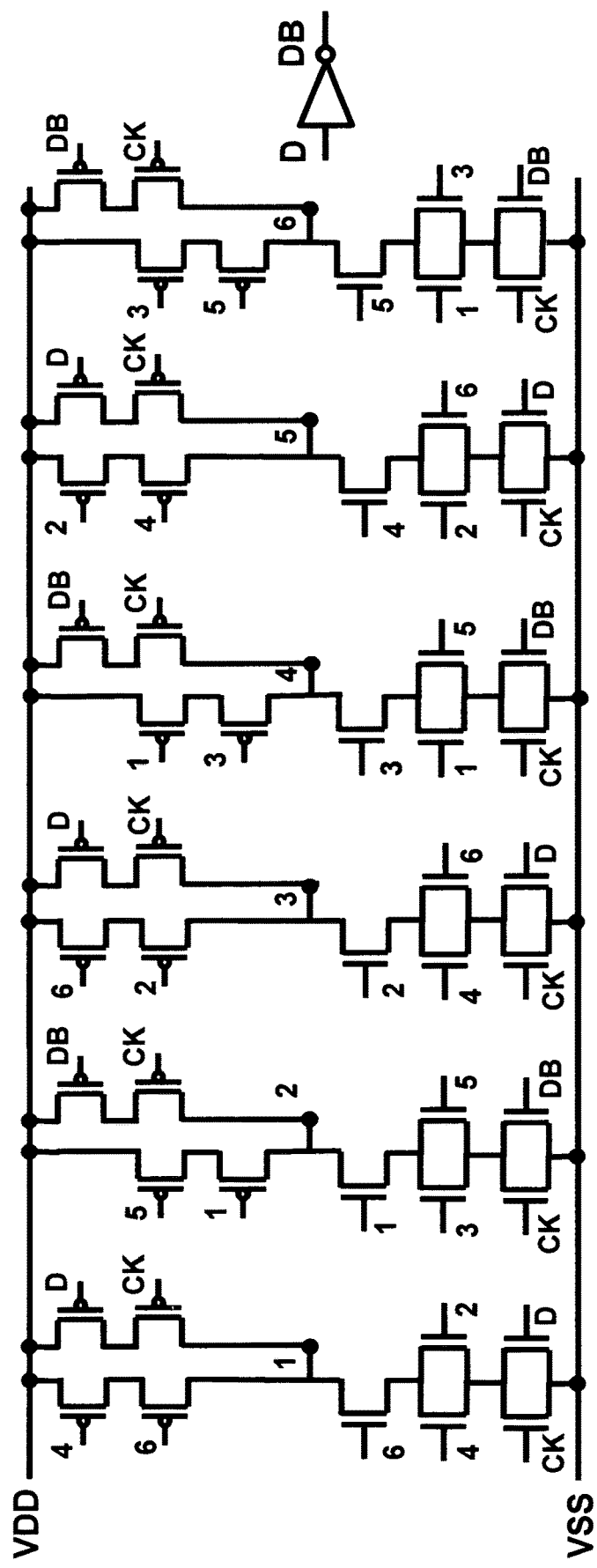

FIG. 27 shows the schematic of a realization of the sequential cell in this invention using the basic circuit from FIG. 12 and using the single-phase clocking circuitry to clock in a data signal.

Figure 28:
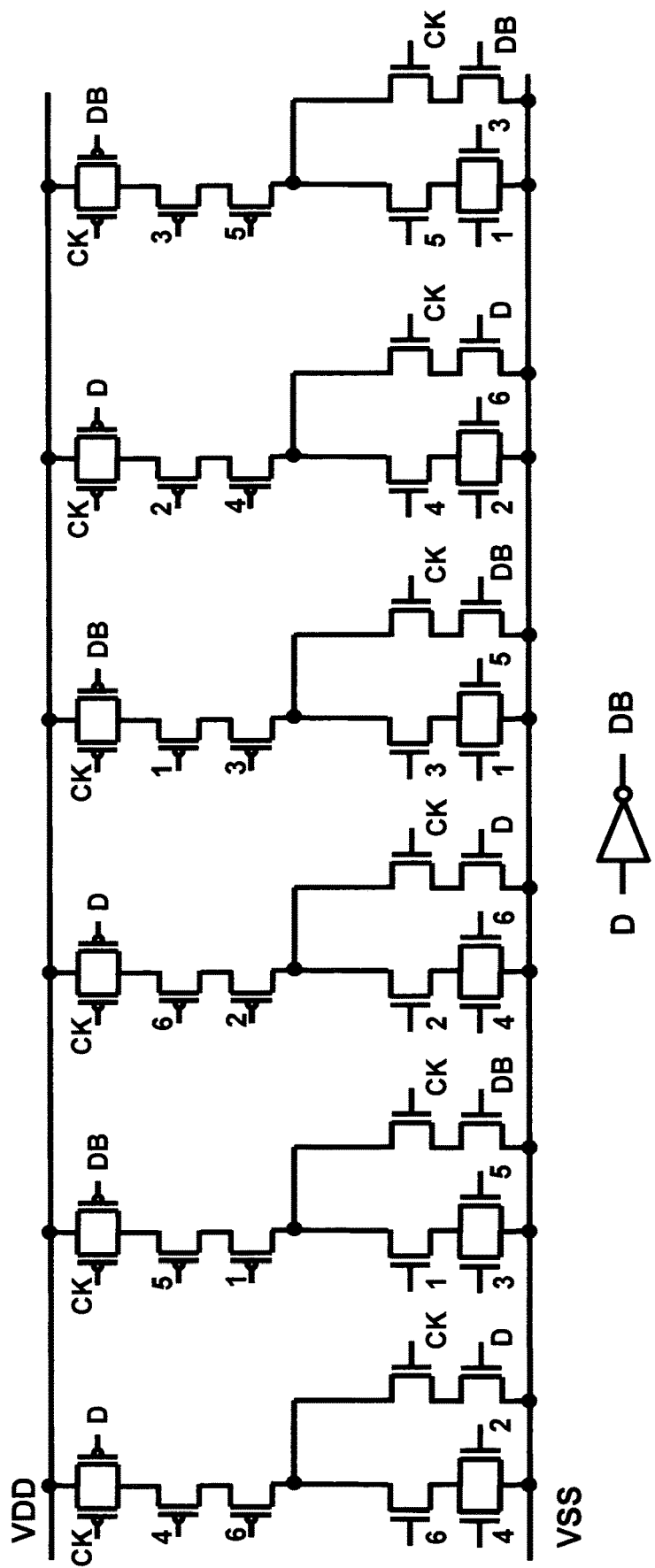

FIG. 28 shows the schematic of a realization of the sequential cell in this invention using the basic circuit from FIG. 12 and using the single-phase clocking circuitry to clock in a data signal.

Figure 29:
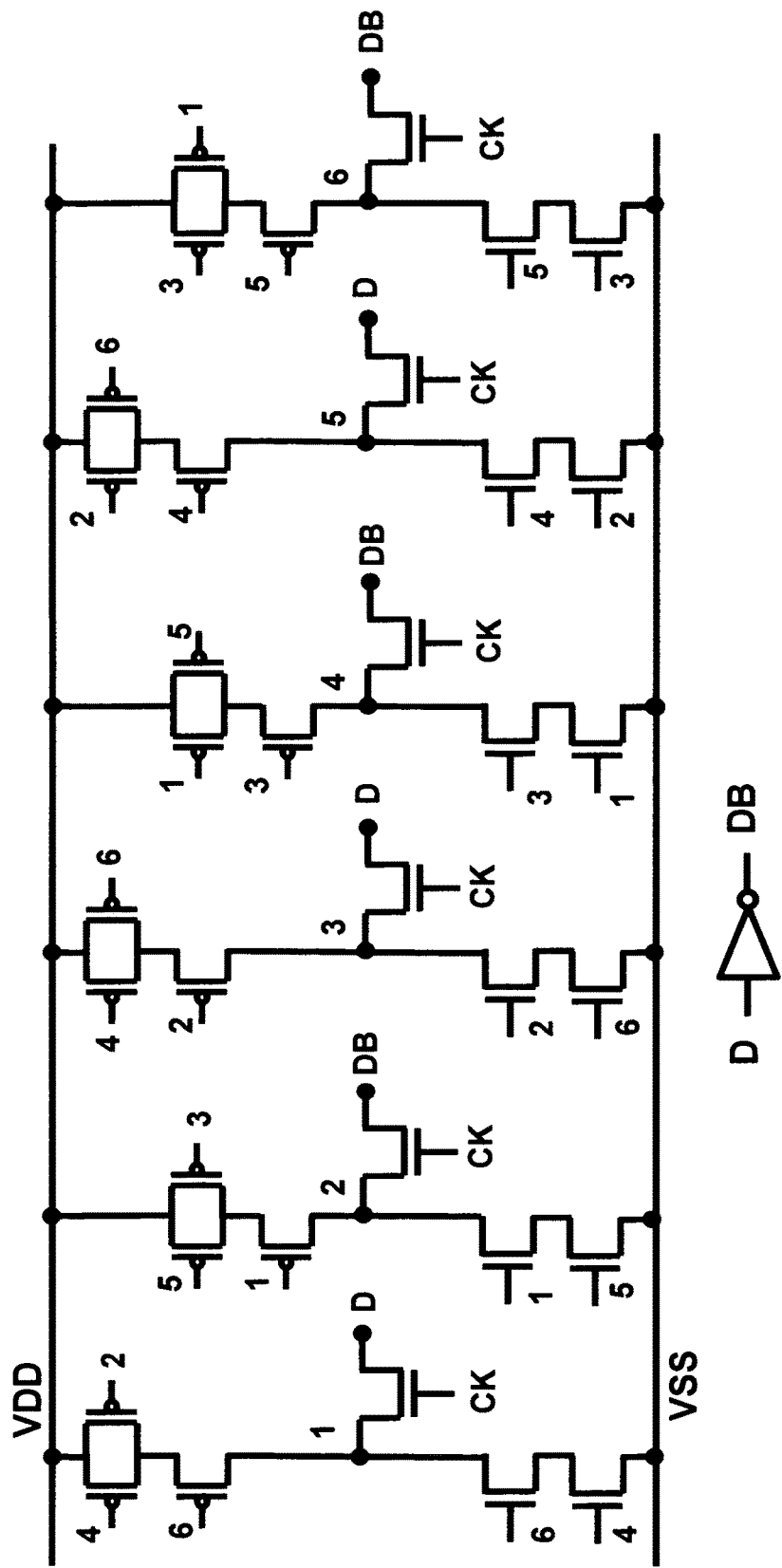

FIG. 29 shows the schematic of a realization of the sequential cell in this invention using the basic circuit from FIG. 11 and using the SRAM-type clocking circuitry to clock in a data signal.

Figure 30:
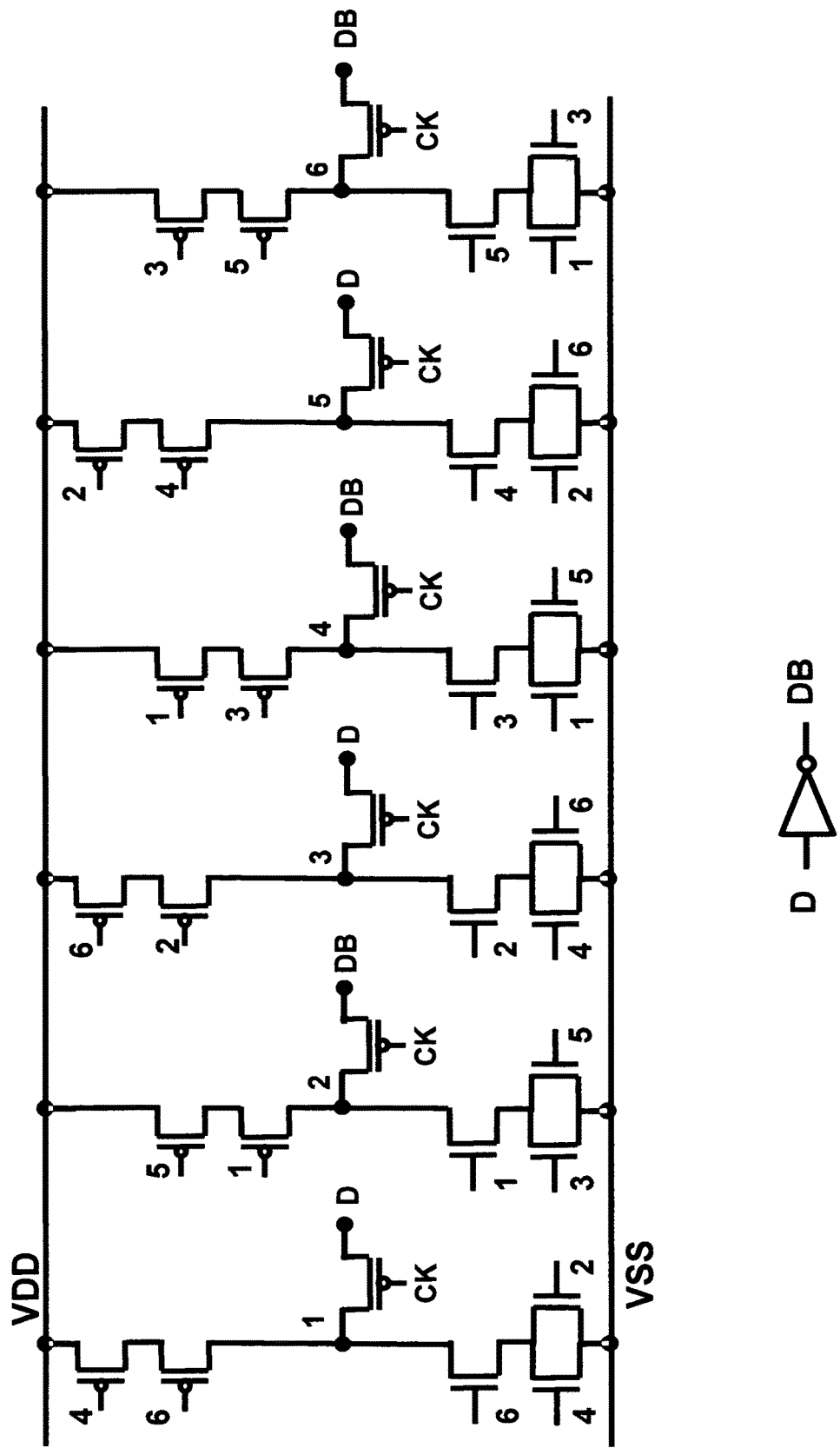

FIG. 30 shows the schematic of a realization of the sequential cell in this invention using the basic circuit from FIG. 12 and using the SRAM-type clocking circuitry to clock in a data signal.

Figure 31:
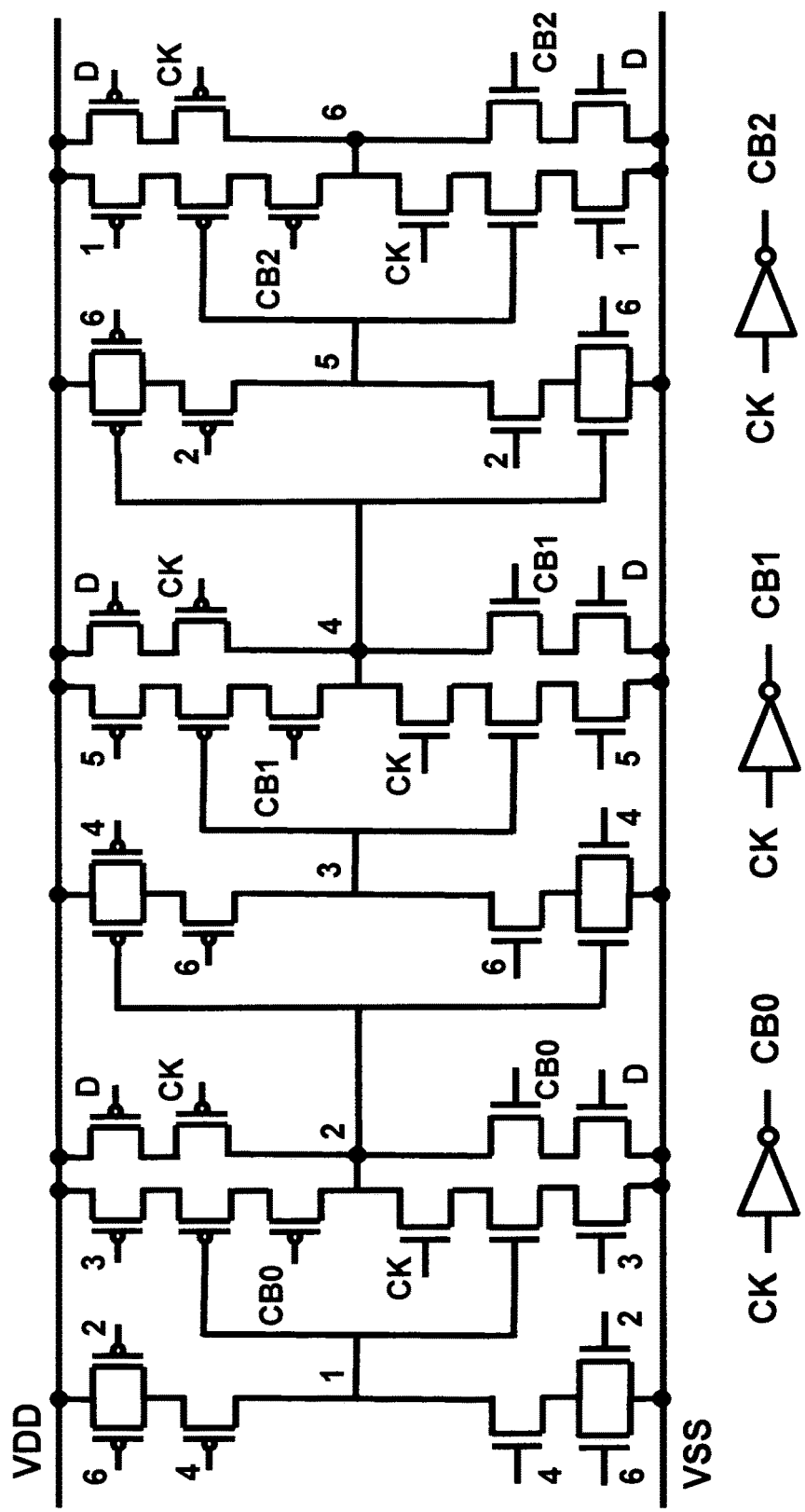

FIG. 31 shows the schematic of a realization of the sequential cell in this invention using the basic circuit from FIG. 10 and the clocked-INV clocking circuitry to clock in a data signal. Unless the circuitry generating the complementary clock signal (CB), or signals (CB0, CB1, CB2), this type of clocking circuitry breaks the circuit property (3).

Figure 32:
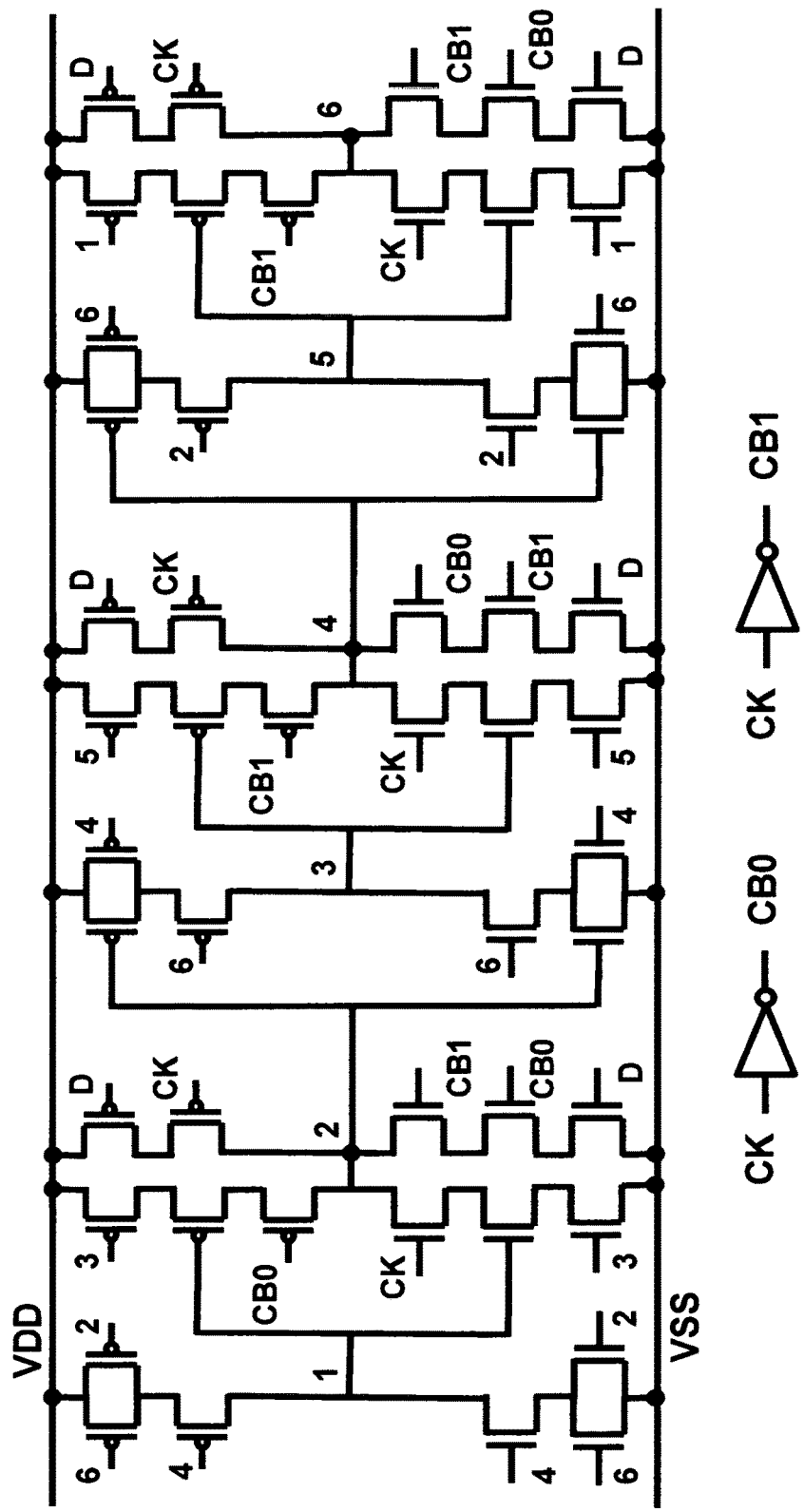

FIG. 32 shows the schematic of a realization of the sequential cell in this invention using the clocked-INV clocking circuitry to clock in a data signal. When the clock-INVs generating CB0 and CB1 are placed in an appropriate way, e.g., as shown in FIG. 26, this circuit does fulfill all 4 circuit properties of the sequential cell in this invention.

Figure 33:
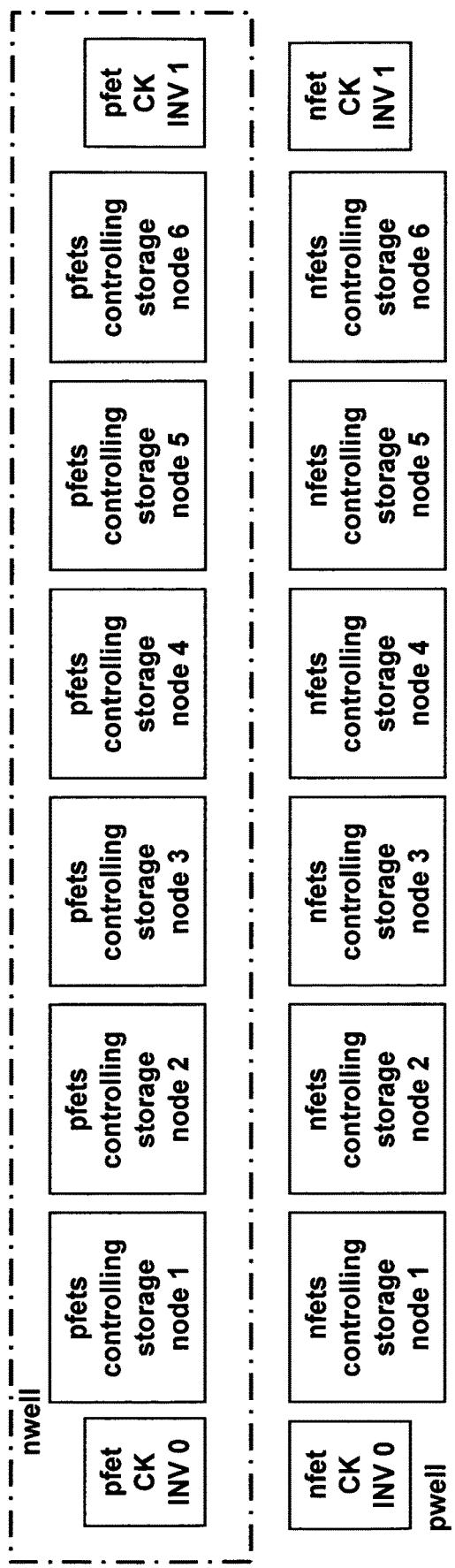

FIG. 33 shows a principle placement arrangement for the two clock-INVs from the circuit from FIG. 25 (CK INV 0 and CK INV 1). With this placement of these INVs the circuit from FIG. 25 does fulfill circuit property (3).

Figure 34:
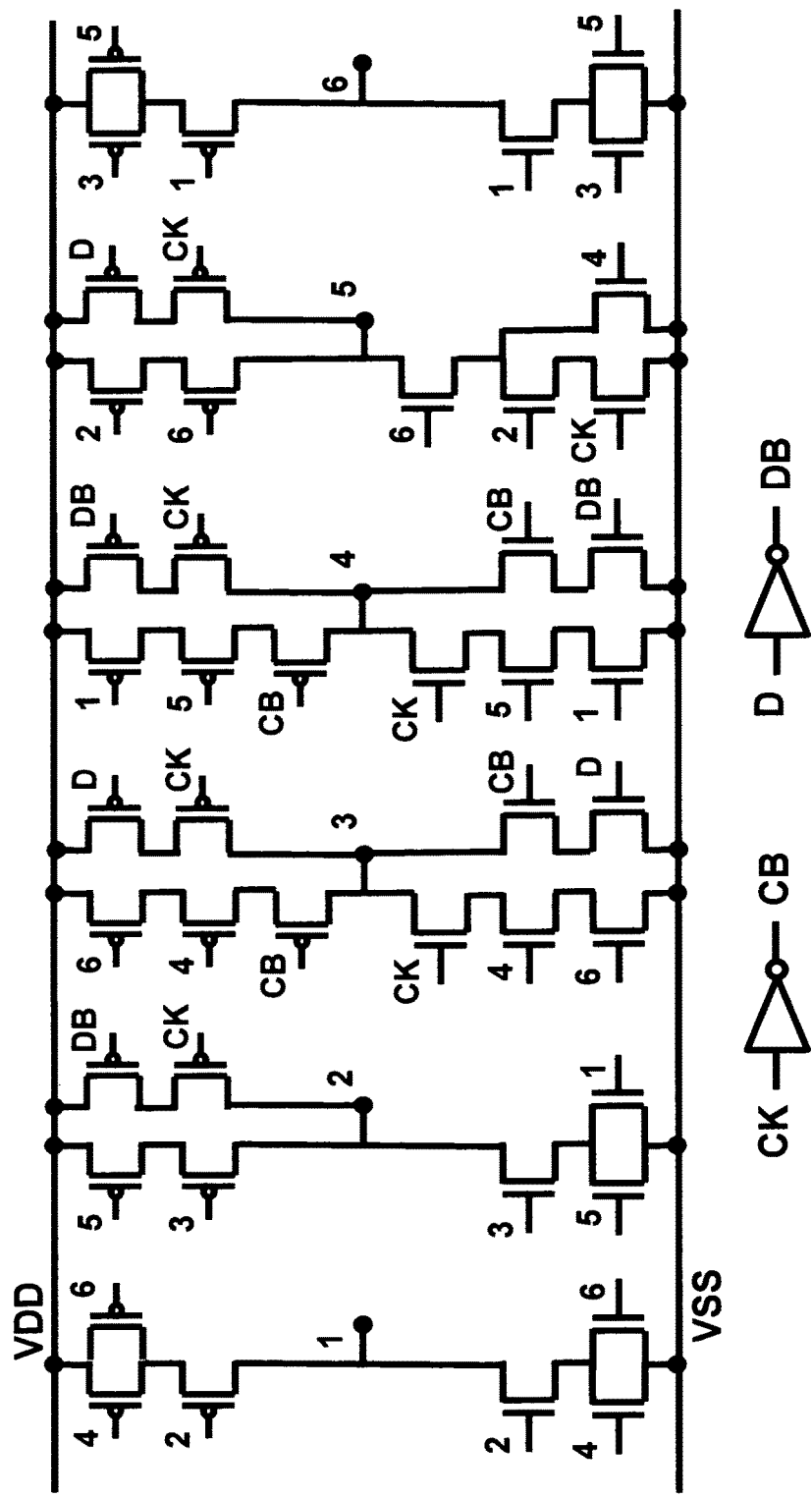

FIG. 34 shows the schematic of a realization of the sequential cell in this invention, using the circuit topology D and using a clocking circuitry that uses both a complementary clock, CB, and a complementary data, DB. clocked-INV clocking circuitry to clock in a data signal. For this particular topology and gate connections, the circuit fulfills the circuit property (3) without using series MOSFETs for the MOSFETs having CB on their gates.

Figure 35:
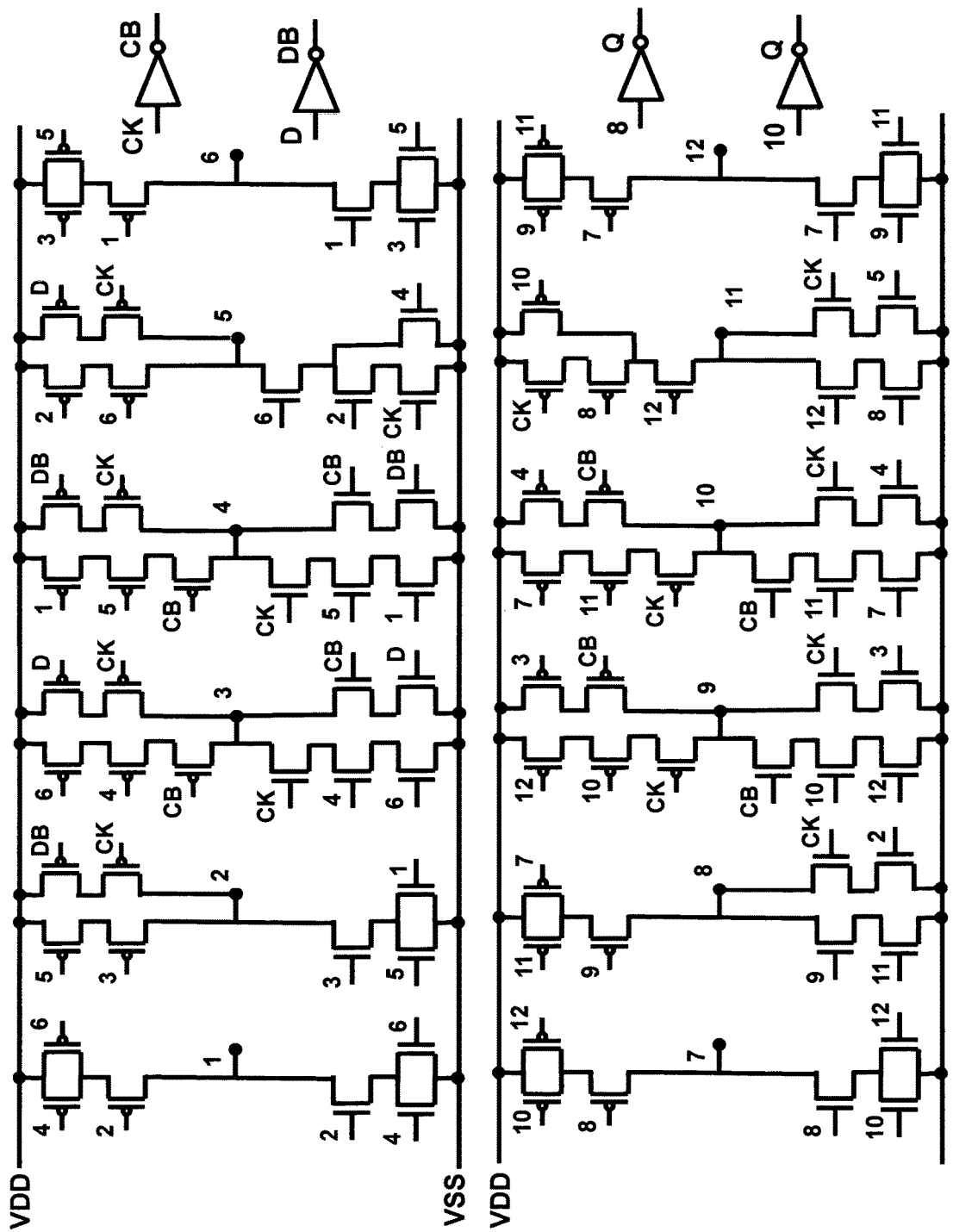

FIG. 35 shows the schematic of a complete flip-flop using two of the sequential cells from this invention. The master latch uses the cell from FIG. 27, and the slave latch uses a cell based on topology E and with a clocking circuitry of the same kind as the master latch.

Figure 36:
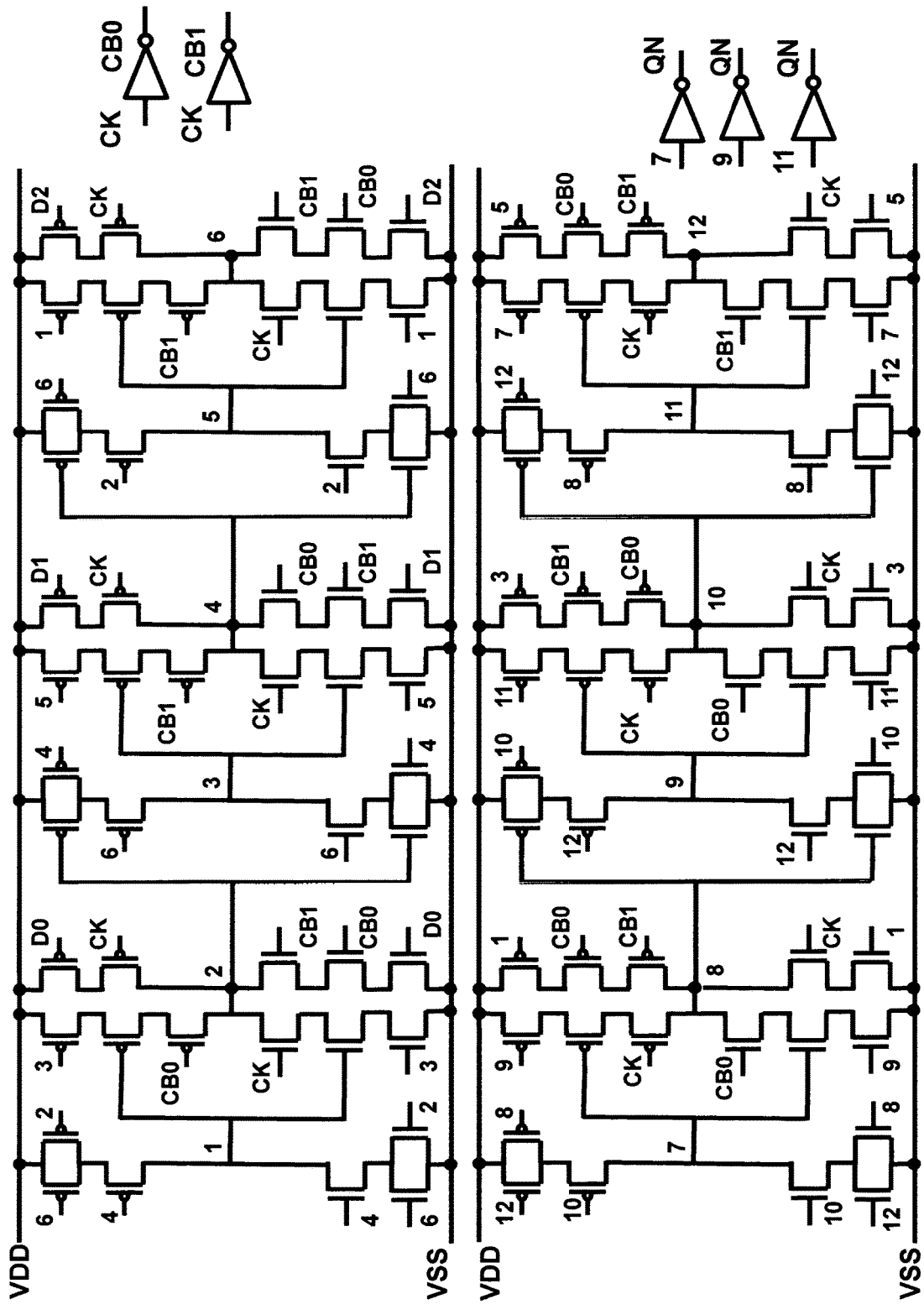

FIG. 36 shows the schematic of a complete flip-flop using two of the sequential cells from this invention. The master latch in this flip-flops uses a configuration of the cell which takes three data inputs (D0, D1, D2), and acts as a voter. When the latch closes (in this case the CK signal going HIGH) the latch will settle into a state determined by the majority of the 3 input data values (i.e., perform a vote of D0, D1, D2).

Figure 37:
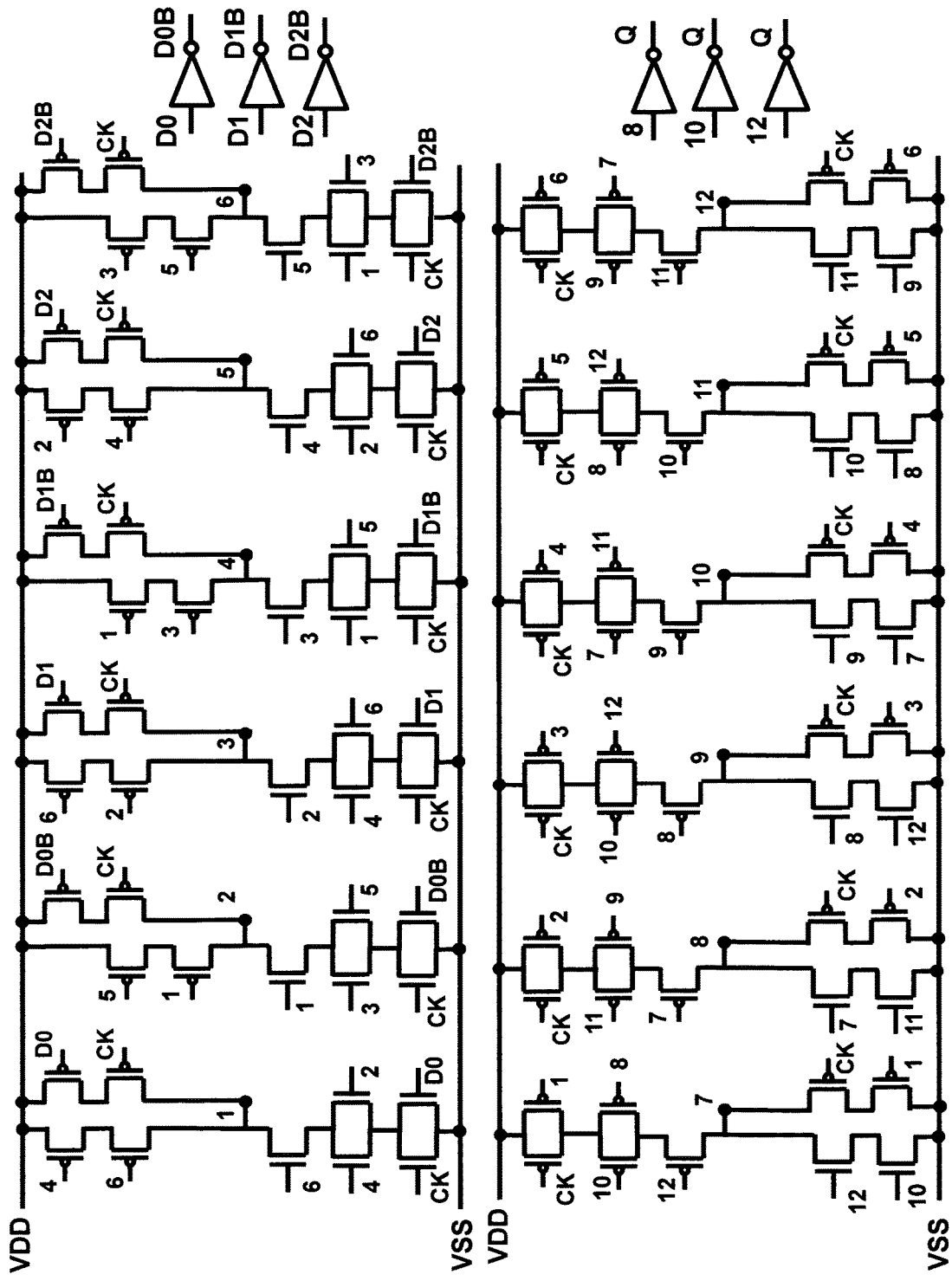

FIG. 37 shows the schematic of a complete flip-flop using two of the sequential cells from this invention. The master latch in this flip-flops uses a configuration of the cell which takes three data inputs (D0, D1, D2), and acts as a voter. When the latch closes (in this case the CK signal going HIGH) the latch will settle into a state determined by the majority of the 3 input data values (i.e., perform a vote of D0, D1, D2).

DETAILED DESCRIPTION OF THE INVENTION AND HOW IT WORKS

In CMOS logic circuits n-type and p-type MOSFETs are connected between a HIGH electric potential value (VDD) and a LOW electric potential value (VSS). The value of the logic is determined by whether a circuit net, e.g., the output of a logic cell, is HIGH (representing binary '1') or LOW (binary '0'). Sequential logic cells are cells that keep their value (i.e., the value of their output), unless it's explicitly changed by a control signal.

This invention comprises a new way to connect n-type and p-type MOSFET devices to form a sequential element that can perform the same function as the prior art sequential logic elements. The new sequential logic thus created contains additional p-type and n-type MOSFET devices and, internally, operates in a different way, w.r.t. how it stores data, and how new data is written in to the cell. This gives this new cell certain new and different properties. One such new property is possible to arrange the different p-type and n-type MOSFET devices, spatially, in a physical implementation of the cell, in a certain way that is very advantageous for the reduction, or removal, of soft errors, and which is not possible to do using (the circuits of) prior art sequential logic cells. Specifically, it is possible to create a physical implementation of this cell using the LEAP technique, in certain cases where such a layout cannot be implemented for the prior art DICE circuit because of special constraint from the semiconductor technology (the design rules of the technology). Another unique property of the new sequential logic cell, is that it can be configured such that it has one single input D and functions precisely as prior art sequential logic cells, or be configured such that it has 3 separate inputs, e.g., D0, D1, D2, and that, in this configuration, the output Q always is the result of a vote between the values of the 3 input data signals. In fact, the basic circuit of this new sequential logic cell is such that the output always is a majority vote of three internally stored data values, and this voting mechanism is accomplished, automatically, through the inter-locked connections of the outputs of internal INV cells, to the input of other internal INV cells. Hence, the new cell can be considered a Voting Interlocked Cell (VICE).

The basic, fundamental circuit schematic of the sequential cell in this invention is shown in FIG. 8. The circuit has six basic storage nodes, nodes 1-6, and these are divided onto two groups (1, 3, 5) and (2, 4, 6). The storage nodes are connected through a set of 2 or 3 p-type MOSFETs to a HIGH voltage (VDD), and through a set of 2 or 3 n-type devices to a LOW voltage (VSS). At least six of the sets of MOSFETs consist of two MOSFETs in parallel, with a third MOSFET connected in series with the two parallel MOSFETs. The remaining sets of MOSFETs consist of 2 MOSFETs connected in series. The gates of these sets of p-type and n-type MOSFETS which connect a storage node from a first group to HIGH (VDD) and LOW (VSS), respectively, are connected to storage nodes from the other group of storage nodes. Furthermore, each storage is connected to at least 2 p-type MOSFETS (from different sets) and at least 2 n-type MOSFETs (from different sets).

The basic circuit described above, and shown in FIG. 8, makes it possible to create a circuit that has the following four properties: (1) the only stable state of the circuit is when all storage nodes from one group of storage nodes (e.g., (1.3.5)) have the same value, either HIGH or LOW, and that this value, in a stable state, always is opposite to the value of all the nets in the other group of storage nodes (e.g., (2, 4, 6)) (all other states are not stable and will, immediately and automatically switch to one of the two stable states, in other words, when node 1, 3, and 5 are LOW, node 2, 4, and 6, will always be HIGH, and vice versa, except during switching of the circuit from one state to another), (2) when an error on one storage net occurs, the circuit will revert back to its original state when the cause of the error is removed, (3) when two errors occur simultaneously on any two different storage node nets, whereby one error is LOW-to-HIGH, and the other is HIGH-to-LOW, the circuit will revert back to its original state when the cause of the error is removed, and (4) means can be introduced to switch the circuit between the two states by a signal (e.g., to change all the storage nodes to their opposite value by mean of a (new) data signal and a clock signal).

The property (1) ensures that no contention is possible in the circuit. In other words, there is no (stable) state for the circuit in which a circuit path exists from the HIGH (VDD) side to the LOW (VSS) side in which all MOSFETs are on.

There are many realizations for the circuit in this invention that have the desired properties (1)-(4). Firstly, different realizations differ by which set of p-type MOSFETs and which set of n-type MOSFETs, that consists of 2 series MOSFETs, and which that consists of 2 parallel MOSFETs with a 3$^{rd}$ MOSFET is series with the 2 parallel MOSFETs. FIG. 9-16 shows eight different circuit topology realizations of this invention. Secondly, different realizations differ by which of the storage nodes that are connected to which of the gates of the MOSFETs. For each circuit topology at least one way to connect the gates of the MOSFETs exists such that the circuit has the circuit properties (1)-(4).

FIG. 17 shows how the MOSFET gates are connected for a specific realization of the circuit topology A. A forced change of one storage nodes in this circuit to its opposite value will be blocked from affecting the storage nodes in the other group through the connections of the n-type and p-type MOSFET gates. The same blocking will apply if one storage node from one group (e.g., 1, 3, 5), and, simultaneously, one storage node from the other group (2, 4, 6) are forced to their opposite values. However, if two storage nodes from the group (2, 4, 6) are forced to their opposite value, then this will cause two of the storage nodes in the group (1, 3, 5) to change to their opposite value, and this will cause the 3rd storage node in the first group to change to its opposite value also, and the circuit will switch to the opposite state. In this realization of the invented circuit, either two storage nodes in the group (2, 4, 6) or all three in the group (1, 3, 5) must be forced to their opposite values in order to change the state of the circuit. When no nodes are forced, the circuit can only be in one of two states, with all storage nodes in one group having the same value, i.e., no states with contention are possible in this circuit. The configuration with 3 n-type and 3 p-type MOSFETs can be used also in circuit leg 2, 4, and 6, and, if so, the circuit would also change its state if two storage nodes from the group (1, 3, 5) are forced to their opposite value.

Different specific realizations of the schematic of the circuit in this invention, for the eight topologies in FIGS. 9-16, are shown in FIGS. 17-24. There are, however, for each basic circuit topology, several additional arrangements for the connections to the gates of the MOSFET device, that fulfill the desired circuit function. All of these realizations are not explicitly generated and listed here, but they are all part of this invention (as would be recognized by someone familiar with electronic circuits). For example, other equivalent circuits for the invented sequential cell can be generated from one of the circuits in FIGS. 17-24 by cyclic permutation, or by switching the legs for two storage nodes from the same group and renumbering the nodes accordingly. As an example of such a re-arrangement it can be noted that the circuit in FIG. 24 for circuit topology H, can be generated from the circuit shown in FIG. 20 (for topology D) by switching two legs in the circuit and re-numbering the nodes accordingly.

The realizations of the invented circuit explicitly shown in FIGS. 17-24, have the additional property that two n-type or p-type MOSFETs that are connected in series, and that connect a storage node from a first group of storage node to HIGH (VDD) or LOW (VSS), always have their gates connected to different storage nodes from the other group of storage nodes. This constraint on the gate connection is sufficient (but is not necessarily required) to ensure that property (3) is fulfilled. If one of the storage nodes in one group (e.g., (2.3.5)) changes its value from HIGH to LOW, none of the sets of p-type MOSFETs that connect any of the storage nodes in the other group (e.g., here (2, 4, 6)) will create a conductive path from the storage node to the HIGH (VDD) node, and therefore all the storage nodes in this (other) group will be unaffected and remain LOW, and vice-versa for one node switching from LOW to HIGH. Hence, one node from one group and one node from the other group can change their values without causing the overall circuit to change its state. Circuit property (3) is fulfilled and when the cause of the circuit node change is removed, the value of all nodes will reverse to the original, correct value, and the circuit, hence, to its original, correct, state.

The immunity to this type of multiple simultaneous errors has important implications when combined with error aware layout optimization using the Layout optimization through Error Aware Positioning (LEAP) method mentioned above. An error generated by radiation (a single event) is, when it occurs in a p-type MOSFET device, always LOW-to-HIGH, and, vice versa, when it occurs in an n-type MOSFET, always HIGH-to-LOW. The circuit in this invention is therefore immune to single event errors that, simultaneously affect one p-type and one n-type MOSFET device. Therefore, the layout arrangement for the p-type devices and for the n-type devices in the logic cells in this invention, can be optimized independently by the LEAP method, which simplifies the LEAP layouts and enables certain implementations of LEAP optimized layouts that are not possible when this layout method is applied to the DICE sequential logic cell.

This invention therefore also entails the LEAP optimized layout arrangements for the invented circuits, whereby, independently for n-type and p-type MOSFET devices, the contact areas of the devices are arranged such that contact areas that are adjacent in the layout always act in opposite ways on the overall circuit state. Specifically for the two groups of the storage nodes discussed above (1, 3, 5) and (2, 4, 6), the contact areas of the n-type devices that are in the circuit leg that connect a storage node from one group, are not placed next to each other, whereas contact areas, that are in legs connecting storage nodes from different groups, are placed next to each other. One such order for the contact areas of n-type MOSFET devices, or p-type MOSFET devices, is 1, 2, 3, 4, 5, 6, where the number refers to (the contact areas of) all MOSFET devices that is part of the set of MOSFETs connecting the storage node with that number to HIGH (VDD) or LOW (VSS) (i.e., that are in the circuit leg of the storage node with that number). Such a layout arrangement is shown in FIG. 25.

In order to operate fully as a logical latch or a logic flip-flop, means for clocking-in a data signal is added to the circuitry, i.e., means to deliberately change the circuit from one state to the other state. This can be done by inserting additional circuitry, using any of the types of clocking circuitry from FIGS. 2-6, or other type of circuitry, that changes the data in either two or three of storage nodes from one group of storage nodes (or two from one group and one from the other group) in any of the realization for the basic circuit schematics in this invention. As would be recognized by someone familiar with electronic circuits, a large number of different ways exist to introduce clocking circuitry into any of the different basic circuit realizations of the sequential logic cell in this invention.

Figure 1:
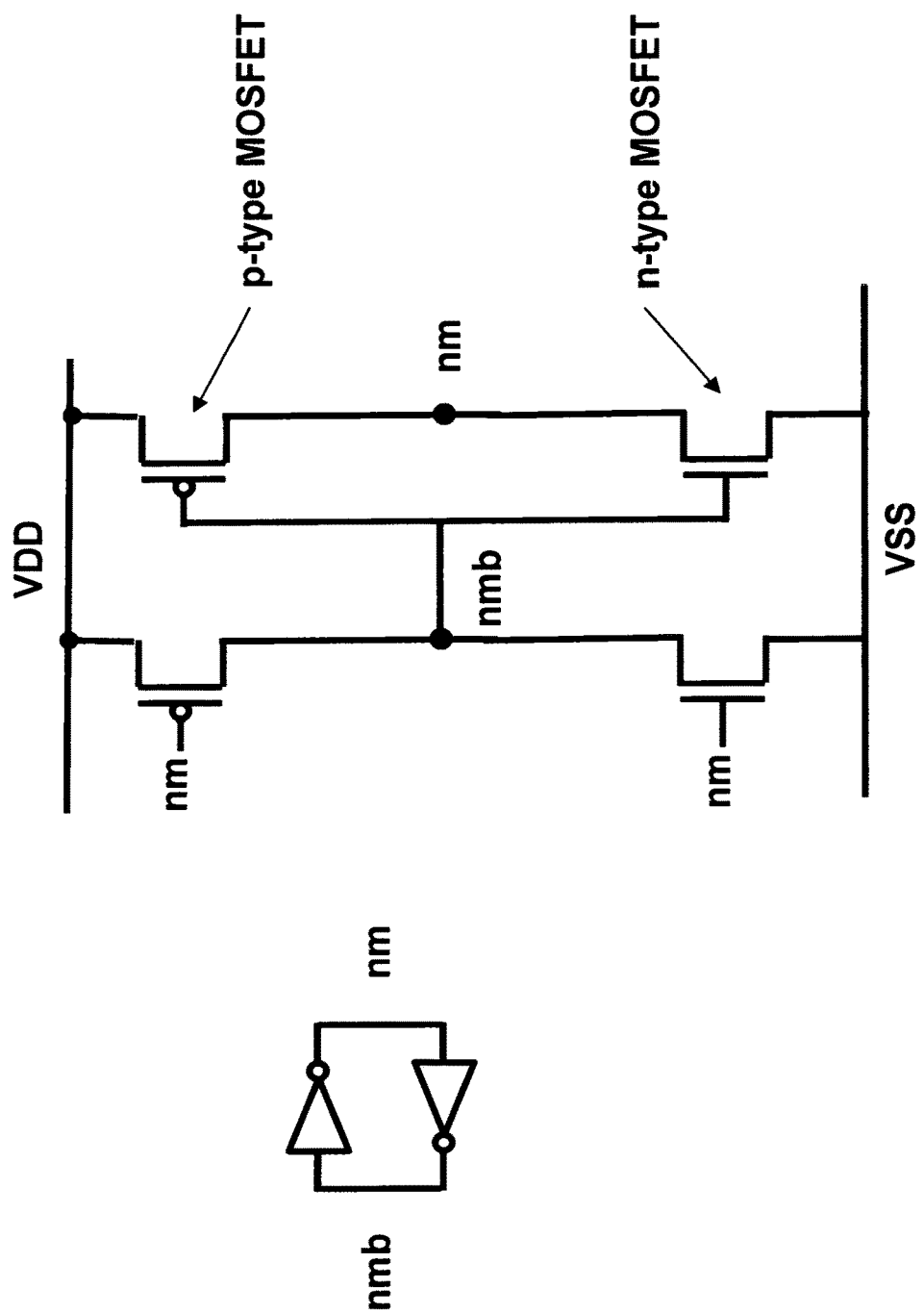
FIG. 1 illustrates the basic cross-coupled INV pair of a sequential logic cell (PRIOR ART).
Figure 2:
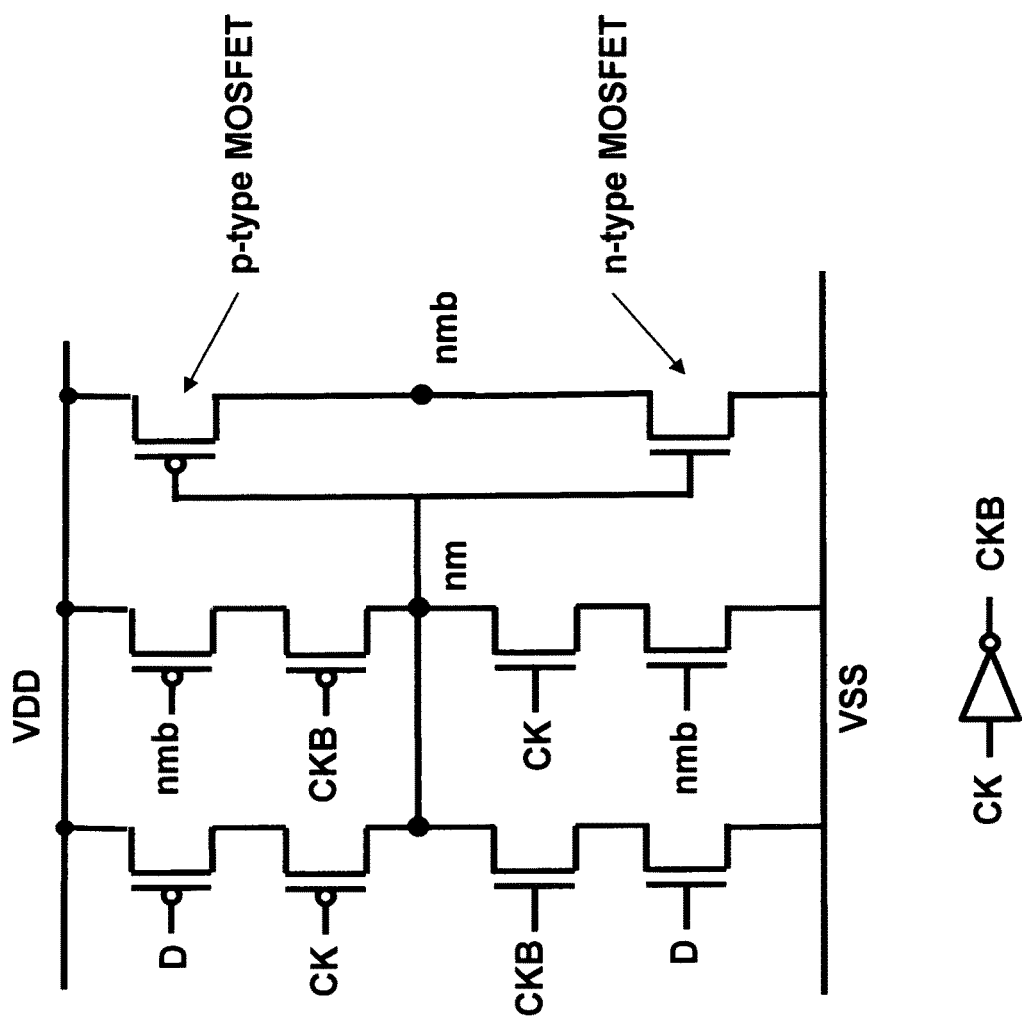
FIG. 2 shows the schematic of a circuit that uses a clocked-INV control of the writing of new data to the basic cross-coupled INV pair (PRIOR ART).
Figure 3:
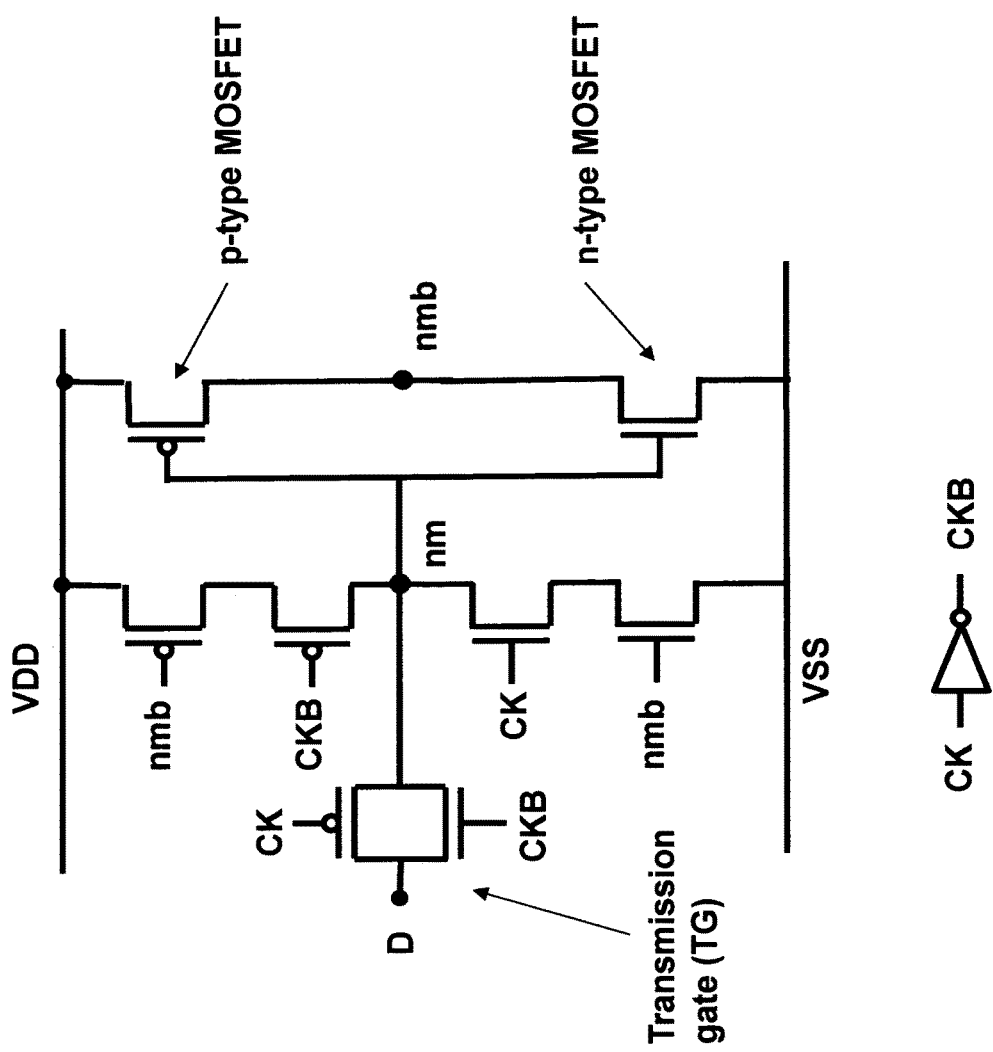
FIG. 3 shows a schematic of a circuit that uses a TG control of the writing of new data to the basic cross-coupled INV pair (PRIOR ART).
Figure 4:
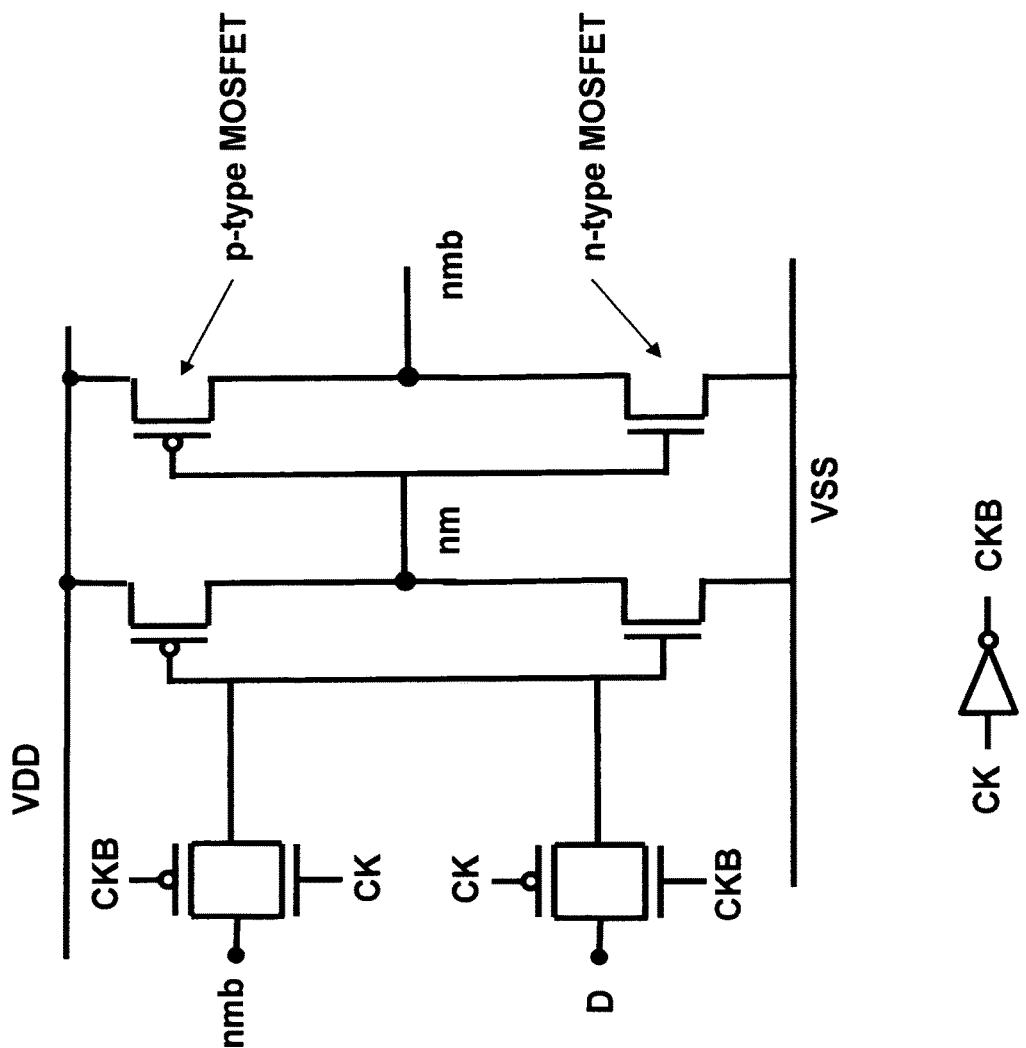
FIG. 4 shows a schematic of a circuit that uses a TG control of the writing of new data to the basic cross-coupled INV pair (PRIOR ART).
Figure 5:
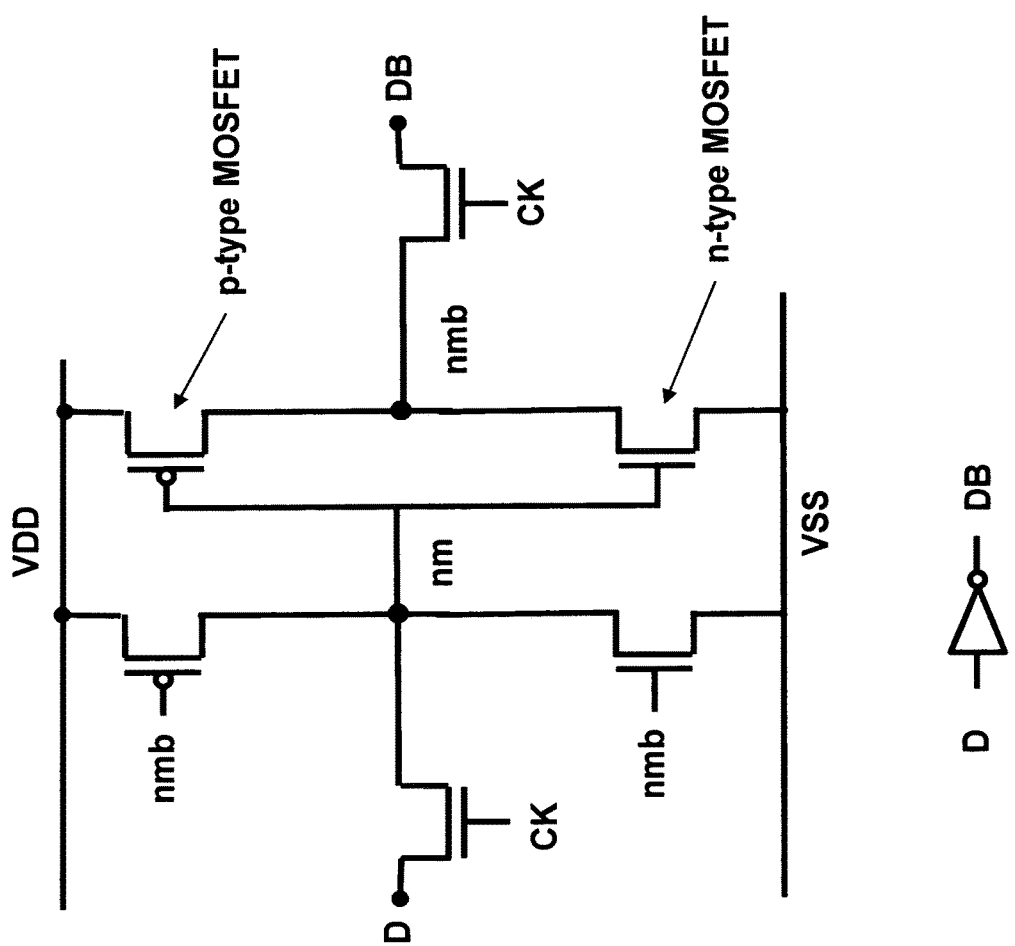
FIG. 5 shows a schematic of a circuit that uses an SRAM type control of the writing of new data to the basic cross-coupled INV pair (PRIOR ART).
Figure 6:
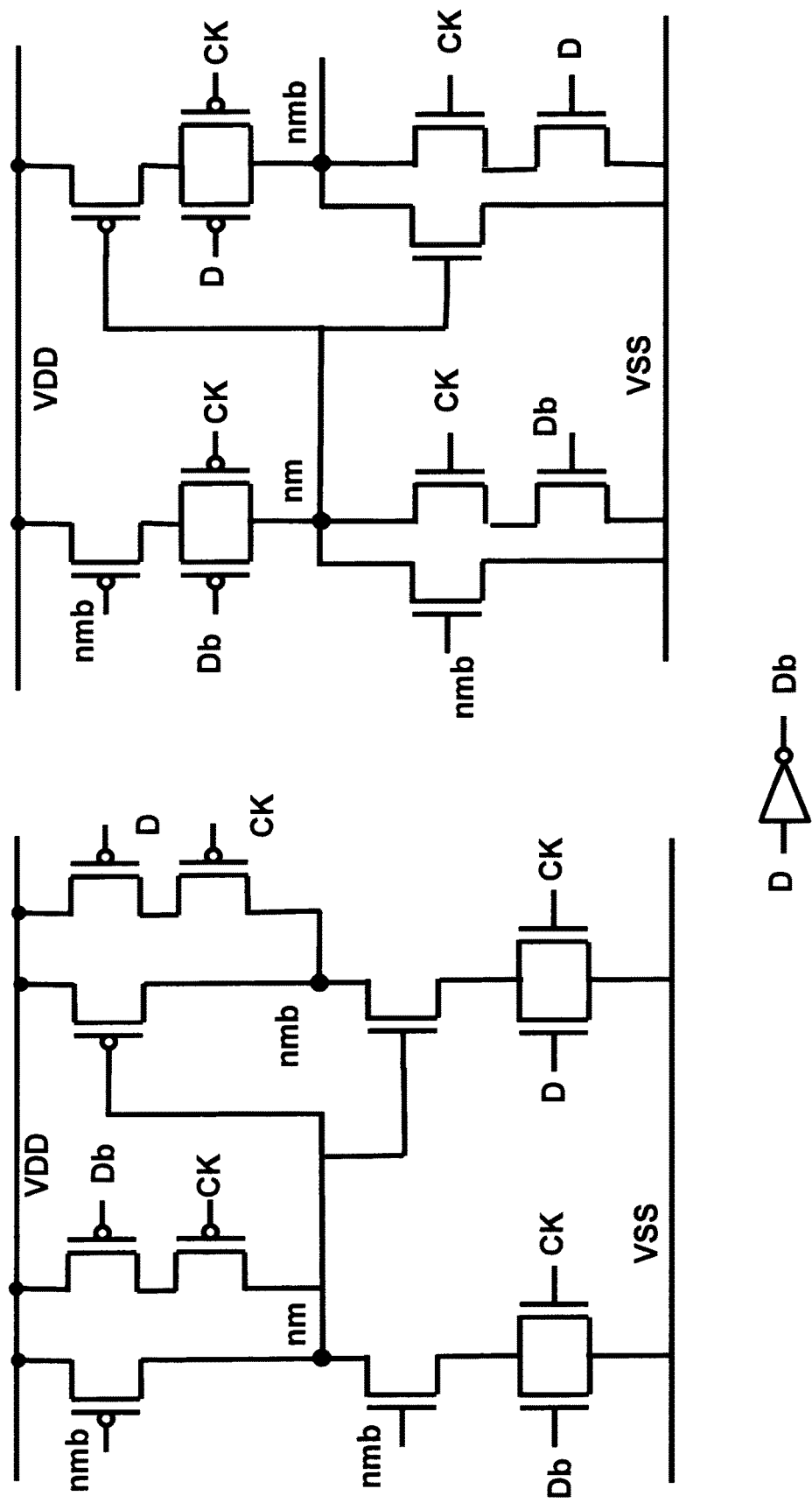
FIG. 6 shows a schematic of a circuit that uses a single-phase clock type control of the writing of new data to the basic cross-coupled INV pair (from U.S. patent Utility application Ser. No. 15/430,484) (PRIOR ART).

FIGS. 26-28 show three examples of the insertion of circuitry for clocking, using the single-phase clocking technique from FIG. 6, for the basic circuits from FIGS. 18 and 19. FIGS. 29 and 20 show examples of the introduction of SRAM-type clocking for the circuit realizations from FIG. 18 and FIG. 19.

The introduction of clocking circuitry using the single-phase or SRAM-type clocking can be done without breaking the basic circuit properties for the sequential cell in this invention, and circuit properties (1)-(4) are fulfilled for the circuit schematics in FIGS. 26-30. However, when a clocking scheme is applied that uses both the clock signal, CK, and its complement, CB, and the generation of the CB signal is part of the sequential cell (i.e., by including one of more INVs for the CK signal in the cell), then an error generated on these clock inverters, i.e., a change of the CB signal, can break the circuit property (3). FIG. 31 shown an example of the introduction of clocking circuitry using the clocked-INV style (from FIG. 2, here using 3 clock-INVs) for the basic circuit realization from FIG. 17. In this circuit, when nodes (1, 3, 5) are LOW and nodes (2, 4, 6) HIGH (stored data is LOW), and the input signal D is HIGH (i.e., data-stored is different from data-in), a single event that simultaneously changes the CB1 node HIGH (caused by a single event on the p-type MOSFET of the clock-INV generating the CB1 signal) and storage node 6 is changed LOW (cause by the single event affecting an n-type MOSFET), the overall circuit will change its state, i.e., circuit property (3) is not fulfilled by this circuit.

One way to maintain circuit property (3) when dual-phase (using both CK and its complement, CB) clocking techniques are applied to the sequential cell in this invention, is to generate the CB signal using an INV that is very resilient to single events, e.g., by using a larger, single-event mitigated INV, such that the single events that change the CB signal can be ignored. Another way is to replace the MOSFETs that have CB on their gate and can break circuit property (3), by two series MOSFETs which have CB signals on their gates generated by separate clock-INVs, and, furthermore, place these clock-INVs in the layout such that one single event cannot affect both these clock INVs and at the same time affect a third node in such a way that circuit property (3) is violated. A clocked-INV clocking for the basic circuit from FIG. 17 that still fulfills circuit property (3) is shown in FIG. 32 (schematic) and FIG. 33 (layout device placement).

Circuitry for clocking in a new signal into the sequential cell of this invention can also apply a combination of the techniques from FIGS. 2-6. FIG. 34 shows the implementation of clocking circuitry, for a sequential cell in this invention based on circuit topology D (FIG. 12), which applies a combination of the clocked-INV technique from FIG. 2, and the single-phase clocking technique from FIG. 6. This realization uses both the complement of the data input (D), DB, and the complement of clock (CK), CB, to change two storage nodes from one group, and one storage node from the other group, in order to switch the state of this cell.

In order for create a flip-flop using the sequential cell in this invention, two cells are connected in series, whereby the output of the first cell, provides the input to the second cell and the control signal (CK) acts in an opposite way for the first and the second cell (in the same way as is done to create a flip-flop using prior art). The input to the second cell is obtained from the values of the storage nodes of the first cell, and any number of them can be used directly as input to the second cell, or they can be combined by some additional logic to form the output signal transferred to the input of the second cell. FIG. 35 shows a flip-flop schematic thus formed, using the sequential cell from FIG. 34 as the first (master) cell, and a sequential cell based on circuit topology E (FIG. 13) as the second (slave) cell.

The clocking circuitry for a sequential cell in this in this invention can be configured such that the cell takes 3 input data signals (D0, D1, D2) and provides a majority vote between these three signals as output. The voting will occur when, as determined by the control signal (CK), the reading phase is over and the sequential cell closes (goes into the state when it stores its data). In order to operate as a voter, the writing in of the three data signals much be in the same way for each storage node in each group of storage nodes. FIGS. 36 and 37 show circuit realizations where the master latch in a flip-flops using the sequential cell in this invention, have been configured as such voting sequential cells. Note that if the three input data signals (D0, D1, D2) in FIGS. 36 and 37 are replaced by a single input data signal D, these circuits operate as regular flip-flops, and, hence, the figures are also examples of flip-flops generated using the sequential cell in this invention.

I claim:

1. An integrated circuit having six storage nodes which can have either a high voltage level (VDD) or a low voltage level (VSS), said storage nodes belonging to two groups of three storage nodes each, each storage node being connected to a high voltage level (VDD) by a set of two or three p-type MOSFET devices, and to a low voltage level (VSS) by a set of two or three n-type MOSFET device, said sets of p-type and n-type MOSFET devices having two devices in series or two devices in parallel and a third device in series with the two parallel devices, the gates of the n-type and p-type MOSFET devices of a set which connect storage nodes from one group to the high or low voltage level, being connected to storage nodes from the other group of storage nodes, the gates of two n-type or p-type MOSFET devices which are connected in series, being connected to different storage nodes, and each storage node being connected to at least two gates of p-type MOSFET devices from different sets, and to at least two gates of n-type MOSFET devices from different sets.

2. The integrated circuit from claim 1 having at least six out of the twelve sets of n-type and p-type MOSFET devices having 3 devices, and six of these sets with 3 MOSFET devices not being identical, i.e., having different device types, or having different signals connected to the gate of the MOSFET devices in the set that are in parallel, or to the gate of the MOSFET device in the set that is in series with the two parallel devices.

3. The integrated circuit from claim 2 having the connections to the gates configured such that (1) if five of the storage nodes are forced, by some external means, to have any arbitrary value between HIGH and LOW, and the sixth storage node being either HIGH or LOW, then, when the external effect is removed, all storage nodes will always revert back to a state where all storage nodes in one group have the HIGH voltage level, and all storage node in the other group have the LOW voltage level, and (2) when all storage nodes in one group have a the LOW voltage level, and all storage nodes in the other group having a the HIGH voltage level, and one storage node from one group is forced, by some external effect, to have the opposite voltage level, and/or one storage node from the other group is forced to have the opposite voltage level, then, when the external effect is removed, all storage nodes will revert back to the same value they had before the external effects were applied to the circuit.

4. The integrated circuit from claim 3 having additional circuitry that connects a data signal input, and a control signal input, to the integrated circuit in such a way that when these two signals have a certain HIGH or LOW voltage levels all the storage nodes will change to the opposite voltage level, whereas when the control signal input has the opposite voltage level, the integrated circuit will remain unaffected and all the storage nodes remain at the same value.

5. The integrated circuit from claim 4 having a spatial arrangement in the physical fabricated integrated circuit, that is such that the contact areas of the MOSFET devices in a set that connects a storage node from one group to the HIGH or LOW voltage level, are not adjacent to contact areas from another set of MOSFET devices of the same type, that connects a storage node from the same group to the HIGH or LOW voltage level, but are adjacent to contact areas from another set of MOSFET devices of the same type, that connects a storage node from the other group to the HIGH or LOW voltage level.

6. An integrated circuit which contains two of the integrated circuits of claim 4, having one or more storage nodes of the first of these circuits providing the data signal input for second circuit, and being such that the when the control signal to the first circuit is such that the first circuit can change the voltage level of its storage nodes, then the control signal to the second circuit is such that it cannot change the voltage level of its storage nodes, and vice versa, when the first integrated circuit cannot change the voltage levels of its storage nodes, then the control signal to the second integrated circuit is such that it changes the voltage levels as determined by the input data signal to the second integrated circuit.

7. The integrated circuit from claim 3 having additional circuitry that connects three data signal inputs, and a control signal input, to the integrated circuit in such a way that when the control signal has a certain HIGH or LOW voltage level the storage nodes will change their values, in different ways depending on the signal level of the three data signal inputs, and when the control signal changes to the opposite value, all storage nodes will revert to one of the two stable states, with all storage nodes in one group having the same voltage level and all storage nodes in the other group having the opposite voltage level, and that this stable state will be different depending on different voltage levels of the three input data signals before the control signal changed, and be equivalent of a majority vote among these three voltage levels of the input data signals.

* * * * *